(12) United States Patent
Miyazaki

(10) Patent No.: US 12,476,453 B2
(45) Date of Patent: Nov. 18, 2025

(54) ELECTRONIC CIRCUITRY, METHOD, COMPUTER PROGRAM, AND ELECTRONIC SYSTEM

(71) Applicant: KABUSHIKI KAISHA TOSHIBA, Tokyo (JP)

(72) Inventor: Koutaro Miyazaki, Taito Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 147 days.

(21) Appl. No.: 18/465,741

(22) Filed: Sep. 12, 2023

(65) Prior Publication Data
US 2024/0283240 A1 Aug. 22, 2024

(30) Foreign Application Priority Data

Feb. 16, 2023 (JP) .................................. 2023-022810

(51) Int. Cl.
*H02H 7/122* (2006.01)
*H02H 1/00* (2006.01)

(52) U.S. Cl.
CPC .......... *H02H 7/122* (2013.01); *H02H 1/0007* (2013.01)

(58) Field of Classification Search
CPC ................. H02H 7/122; H02H 1/0007; H03K 2217/0027; H03K 17/0828; H03K 17/567
USPC ........................................................ 361/18
See application file for complete search history.

(56) References Cited

U.S. PATENT DOCUMENTS

| 8,633,755 | B2 * | 1/2014 | Kawamoto | .......... H03K 17/163 327/434 |
| 10,601,415 | B2 | 3/2020 | Norling et al. | |
| 10,868,529 | B2 | 12/2020 | Norling et al. | |
| 2009/0243764 | A1 * | 10/2009 | Hauenstein | .......... H03K 17/689 333/24 C |
| 2011/0304941 | A1 * | 12/2011 | Tanimura | .................. H02J 3/14 361/93.9 |
| 2013/0083442 | A1 | 4/2013 | Hiyama | |
| 2016/0028219 | A1 * | 1/2016 | Habu | ...................... H03F 3/217 361/101 |

(Continued)

FOREIGN PATENT DOCUMENTS

CN 102315632 B * 5/2014
JP 2020-136875 A 8/2020
(Continued)

*Primary Examiner* — Sreeya Sreevatsa
(74) *Attorney, Agent, or Firm* — Finnegan, Henderson, Farabow, Garrett & Dunner, LLP

(57) ABSTRACT

An electronic circuitry includes: a comparison circuit to detect a first voltage at a first node relating to a first end of a semiconductor switching element and output a first signal in response to the first voltage larger than a predetermined voltage or equal to; a first filter including a first switch between the first node and a second end of the element, the first filter turning on the first switch for a first time based on a control signal indicating conduction of the element; and a second filter to, in response to the first signal output for at least a second time, generate a second signal indicating an overcurrent of the element, wherein the electronic circuitry changes at least one of: a first waveform related to driving of the semiconductor switching element based on the control signal; the second time; the first time; or the predetermined voltage.

19 Claims, 13 Drawing Sheets

(56) References Cited

U.S. PATENT DOCUMENTS

| | | | | |
|---|---|---|---|---|
| 2019/0253046 A1* | 8/2019 | Nakagawa | ....... | H03K 17/08122 |
| 2020/0228109 A1* | 7/2020 | Bachhuber | ......... | H03K 17/0828 |
| 2021/0351770 A1 | 11/2021 | Liu et al. | | |
| 2023/0086132 A1* | 3/2023 | Miyazaki | ............ | H02M 1/0009 |
| | | | | 361/101 |

FOREIGN PATENT DOCUMENTS

| | | | | |
|---|---|---|---|---|
| JP | 2023-42412 A | | 3/2023 | |
| WO | WO-2021152734 A1 * | 8/2021 | ......... | H03K 17/0828 |

* cited by examiner

RANDOM SEARCH SCHEME

ELECTRONIC CIRCUITRY, METHOD, COMPUTER PROGRAM, AND ELECTRONIC SYSTEM

CROSS REFERENCE TO RELATED APPLICATIONS

This application is based upon and claims the benefit of priority from the prior Japanese Patent Application No. 2023-022810, filed on Feb. 16, 2023, the entire contents of which are incorporated herein by reference.

FIELD

Embodiments described herein relate generally to an electronic circuitry, a method, a computer program, and an electronic system.

BACKGROUND

When an overcurrent flows to a power device used in an inverter circuit or the like, the power device is likely to be broken. Therefore, the overcurrent needs to be detected and interrupted in a short time. A function of detecting an overcurrent state from an inter-output terminal voltage and automatically cutting off a gate of the power device to protect the power device from a short circuit is called a DESAT (Desaturation) function.

As a method of forming a circuit that executes the DESAT function (a DESAT protection circuit), there has been a method of adjusting a circuit configuration while replacing an external resistor and an external capacitor such that protection appropriately functions on various power devices and substrates. In this method, when the DESAT protection circuit is incorporated in an evaluation system and an evaluation test for the DESAT protection circuit is performed, there has occurred time and labor for, every time the adjustment is performed, disassembling the evaluation system and replacing components and, thereafter, reassembling the evaluation system.

In the power device, ringing of an inter-terminal voltage sometimes occurs at a switching time. In order to prevent a short circuit (an overcurrent) from being erroneously detected because of the influence of the ringing, it is conceivable to increase a blanking time in the DESAT protection circuit. However, since a time in which a high-speed power device can withstand a short circuit is short, if the blanking time is increased, a time until the short circuit is detected exceeds an allowable time and a start of protection is delayed.

DETAILED DESCRIPTION

Figure 1:
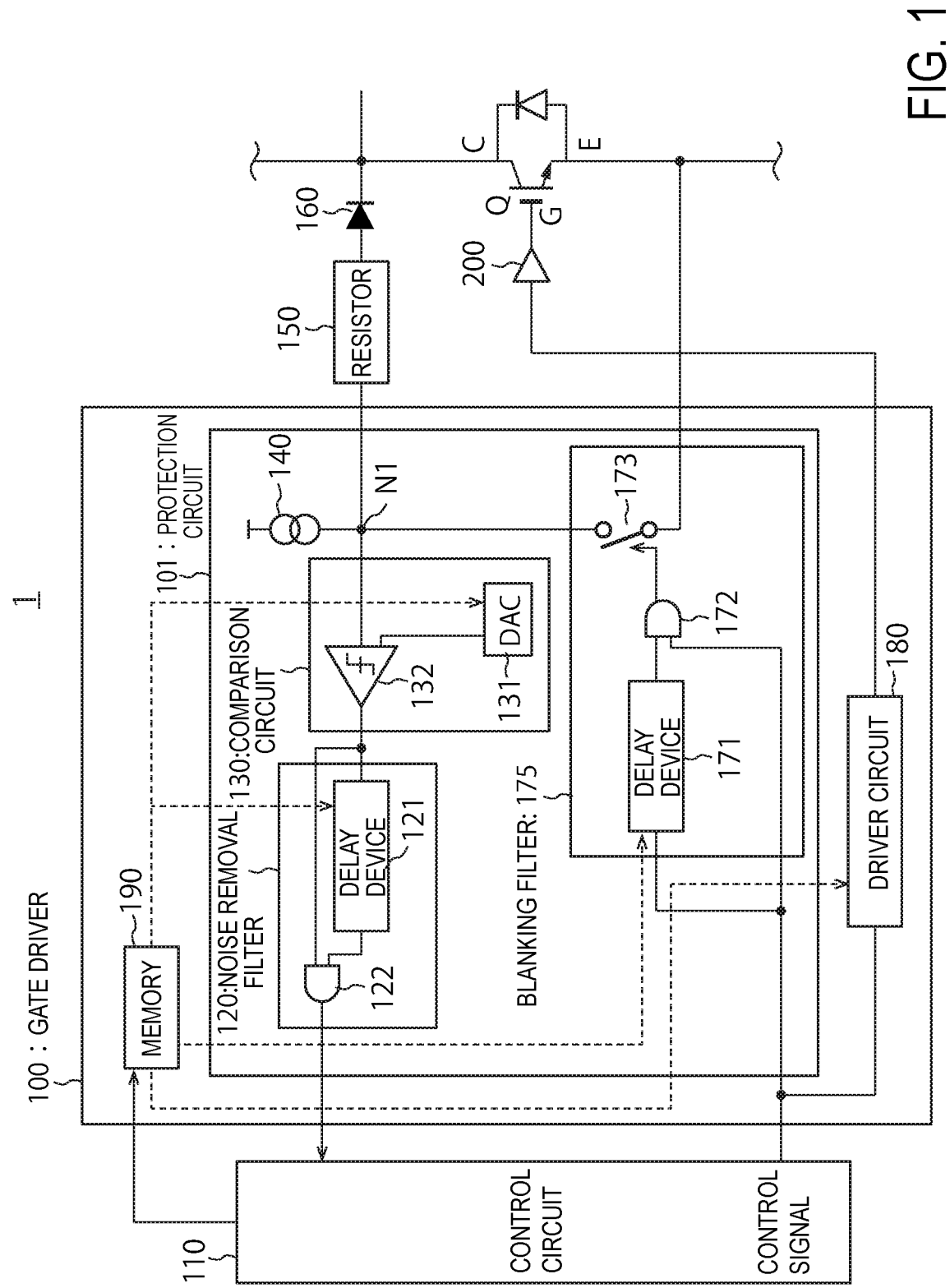
FIG. 1 is a block diagram of an electronic circuitry according to an embodiment.

According to one embodiment, an electronic circuitry includes: a comparison circuit configured to detect a first voltage at a first node relating to a first end of a semiconductor switching element and output a first signal in response to the first voltage being equal to or larger than a predetermined voltage; a first filter including a first switch connected between the first node and a second end of the semiconductor switching element, the first filter turning on the first switch for a first time based on a control signal indicating conduction of the semiconductor switching element; and a second filter configured to, in response to the first signal being output for at least a second time or more, generate a second signal indicating an overcurrent of the semiconductor switching element, wherein the electronic circuitry changes, based on the second signal, at least one of: a first waveform related to driving of the semiconductor switching element based on the control signal; the second time; the first time; or the predetermined voltage.

An embodiment of the present invention is explained below with reference to the drawings. In the drawings, the same components are denoted by the same reference numerals and signs and explanation of the components is omitted as appropriate.

FIG. 1 is a block diagram of an electronic circuitry 1 according to this embodiment. The electronic circuitry 1 roughly includes a semiconductor switching element Q, a gate driver 100 that drives the semiconductor switching element Q and protects the semiconductor switching element Q from an overcurrent (an abnormality), and a control circuit 110 that controls the gate driver 100. Further, the electronic circuitry 1 includes a resistor 150 and a diode 160 provided between the gate driver 100 and a collector (C) of the semiconductor switching element Q and a buffer element 200 provided between the gate driver 100 and a control terminal (a gate) G of the semiconductor switching element Q.

The gate driver 100 includes a protection circuit 101 that protects the semiconductor switching element Q from an overcurrent, a driver circuit 180 that generates a driving signal to be supplied to the control terminal G of the semiconductor switching element Q and supplies the generated driving signal, and a memory 190. The buffer element 200 is connected between the control terminal G of the semiconductor switching element Q and the driver circuit 180. The buffer element 200 has a function of buffering the driving signal supplied from the driver circuit 180 to the control terminal of the semiconductor switching element Q. Note that the buffer element 200 can be omitted. As an example of the buffer element 200, an amplifier that amplifies an input current to one time or one or more times can be used. Various parameters (explained below) for controlling an operation of the protection circuit 101 are stored in the memory 190. The memory 190 may be either a volatile memory or a nonvolatile memory. Examples of the volatile memory include a DRAM (Dynamic Random Access Memory) and an SRAM (Static Random Access Memory). Examples of the nonvolatile memory include a NAND flash memory, a NOR flash memory, an ReRAM (Resistive Random Access Memory), and an MRAM (Magnetoresistive Random Access Memory). Values of the various parameters can be adjusted by the control circuit 110.

The semiconductor switching element Q is a transistor that drives a load device (not illustrated) with a switching operation. In this embodiment, the semiconductor switching element Q is an IGBT (Insulated Gate Bipolar Transistor). A diode 210 that prevents a backflow is connected to the IGBT between an emitter (E) and a collector (C). However, the semiconductor switching element Q may be a power MOSFET, a bipolar transistor, a thyristor, or the like or another power device. The semiconductor switching element Q may be an SiC power transistor, a GaN power transistor, or the like or another high-speed power device. A collector corresponding to a first end of the semiconductor switching element Q is connected to a predetermined node. An emitter corresponding to a second end of the semiconductor switching element Q is connected to a reference voltage. The emitter may be connected to a voltage other than the reference voltage. The predetermined node may be, for example, a power supply voltage or a terminal of another transistor or the like (for example, a collector of another IGBT).

The control circuit 110 controls the electronic circuitry 1. The control circuit 110 includes a microprocessor, a processor, or the like that executes software (a program) for control. However, the control circuit 110 may be composed of a dedicated circuit such as a digital circuit or an analog circuit or may include both of the dedicated circuit and the processor or the like. The control circuit 110 generates a control signal including one or more pulses (first pulses) indicating ON of the semiconductor switching element Q and outputs the generated control signal to the gate driver 100. The control signal is, for example, a PWM signal and a signal alternately including a time indicating ON and a time indicating OFF. The control signal is input to the driver circuit 180 and a blanking filter 175 (a first filter) in the protection circuit 101. Note that a circuit that generates the control signal may be provided as a circuit separate from the control circuit 110.

The gate driver 100 is connected to the control circuit 110 via a wire. The driver circuit 180 of the gate driver 100 receives, from the control circuit 110, a control signal including a pulse indicating ON of the semiconductor switching element Q. The driver circuit 180 generates, based on the control signal, a driving signal for the semiconductor switching element Q. Processing for the driver circuit 180 to generate the driving signal from the control signal is performed according to a driver parameter (a first parameter) stored in the memory 190. The driver 35 parameter indicates a driving signal having what kind of a waveform is generated from the control signal including the pulse indicating ON. At an initial value of the driver parameter, the control signal may be directly output as the driving signal. The driver parameter in the memory 190 can be changed by the control circuit 110.

The semiconductor switching element Q receives the driving signal in the control terminal (the gate) G from the driver circuit 180 of the gate driver 100 and is driven according to the driving signal. In the semiconductor switching element Q, in a state in which the collector and the emitter are not conducted, a collector voltage (or a collector-to-emitter voltage) is a high voltage and is larger than a threshold voltage (a detection threshold), which is a predetermined voltage serving as a reference for a protecting operation start explained below. According to a rise of the gate voltage, the collector voltage drops, the collector and the emitter are conducted by turn-on, and the collector voltage decreases. An electric current (a collector current) determined according to the collector voltage, a parasitic inductor, and the like flows to the semiconductor switching element Q.

The protection circuit 101 includes the blanking filter 175 (the first filter), a comparison circuit 130, a current source 140, and a noise removal filter 120 (a second filter).

A cathode side of the diode 160 is connected to the collector of the semiconductor switching element Q. Consequently, the diode 160 prevents an electric current from being input from the collector of the semiconductor switching element Q. A node N1 relating to the collector of the semiconductor switching element Q is located between the comparison circuit 130 and the resistor 150. The node N1 is connected to a terminal on an anode side of the diode 160 via the resistor 150. A voltage correlating to the collector of the semiconductor switching element Q appears in the node N1 via the diode 160 and the resistor 150. Note that the resistor 150 may be omitted. The current source 140 that supplies a constant current is connected to the node N1. As an example, the current source 140 is formed by using an NMOS transistor, a PMOS transistor, or the like. The current source 140 is connected to the emitter E of the semiconductor switching element Q via a discharge switch 173 of the blanking filter 175.

The blanking filter 175 includes a delay device 171, an AND circuit (an AND logic circuit) 172, and the discharge switch 173 (a first switch). The discharge switch 173 is a switch that connects the node N1 and the emitter E of the semiconductor switching element Q. As an example, the discharge switch 173 is a PMOS transistor, an NMOS transistor, or the like. However, the discharge switch 173 may be a transistor of another type such as a bipolar transistor or may be a circuit other than a transistor. One end of the discharge switch 173 is electrically connected to the emitter E of the IGBT 200, the other end of the discharge switch 173 is connected to the node N1, and a control terminal of the discharge switch 173 is connected to an output terminal of the AND circuit 172.

A control signal input to the protection circuit 101 from the control circuit 110 is input to the delay device 171 and the AND circuit 172. The delay device 171 delays the control signal by a set time (a delay time) and outputs the control signal to the AND circuit 172. When both of the delayed control signal output from the delay device 171 and the control signal input from the control circuit 110 indicate ON (a high level), the AND circuit 172 outputs an instruction signal (an OFF signal) for turning off the discharge switch 173. When one of the control signals indicates OFF (a low level), the AND circuit 172 outputs an instruction signal (an ON signal) for turning on the discharge switch 173.

The discharge switch 173 receives the instruction signal via the AND circuit 172 and is turned on and off based on the instruction signal. Therefore, when a control signal including a pulse indicating conduction (turn-on) of the semiconductor switching element Q is input to the protection circuit 101 from the control circuit 110, the discharge switch 173 is turned off with a delay of a delay time of the delay device 171 after the pulse is input. The discharge switch 173 connects the node N1 and the emitter E while an ON signal is input and separates the node N1 and the emitter E while an OFF signal is input. The blanking filter 175 (the first filter) turns on the discharge switch 173 by the delay time of the delay device 171 at a turn-on operation start time of the semiconductor switching element Q to suppress a voltage input to the comparison circuit 130 or a voltage at the node N1 (details are explained below).

The comparison circuit 130 includes a comparator 132 and a DAC 131. The comparator 132 detects a voltage of the collector of the semiconductor switching element Q via the resistor 150 and the diode 160. The comparator 132 compares a voltage (a detected voltage) at the node N1 and a threshold voltage (a detection threshold) indicated by an output signal of the DAC 131 and outputs a signal (a first signal) corresponding to a comparison result. As an example, when the detected voltage is equal to or larger than the threshold voltage, the comparator 132 outputs, as the comparison result, a high level signal indicating occurrence of an overcurrent and, when the detected voltage is smaller than the threshold voltage, the comparator 132 outputs, as the comparison result, a low level signal indicating that an overcurrent has not occurred. However, a relation between the high level signal and the low level signal to be output corresponding to the comparison result may be opposite.

The threshold voltage output from the DAC 131 can be adjusted or changed according to a threshold voltage parameter (a third parameter) stored in the memory 190. The DAC 131 reads the threshold voltage parameter stored in the memory 190 and sets the threshold voltage according to the threshold voltage parameter. The threshold voltage parameter stored in the memory 190 can be adjusted by the control circuit 110.

The collector voltage is a high voltage at the turn-on operation start time of the semiconductor switching element Q. However, the blanking filter 175 keeps the discharge switch 173 on for the delay time of the delay device 171 at an operation start time to prevent the voltage at the node N1 from rising to be equal to or larger than the threshold voltage of the comparator 132. This prevents erroneous detection of an overcurrent in the comparison circuit 130. That is, since the discharge switch 173 connects the node N1 and the emitter E while an ON signal is input, the voltage at the node N1 is an emitter voltage of the semiconductor switching element Q. Since the emitter voltage is sufficiently smaller than the threshold voltage used in the comparator 132 of the comparison circuit 130 (a value of a digital signal output from the DAC 131), the comparator 132 does not detect an overcurrent while the discharge switch 173 is on. The collector voltage decreases according to an elapsed time from conduction (turn-on) of the semiconductor switching element Q. After the delay time of the delay device 171 elapses, the discharge switch 173 is turned off and the collector voltage appears in the node N1 via the diode 160 and the resistor 150. Thereafter, when an overcurrent or the like occurs at a normal operation time, the voltage at the node N1 rises and the comparison circuit 130 can detect the overcurrent.

Figure 2:
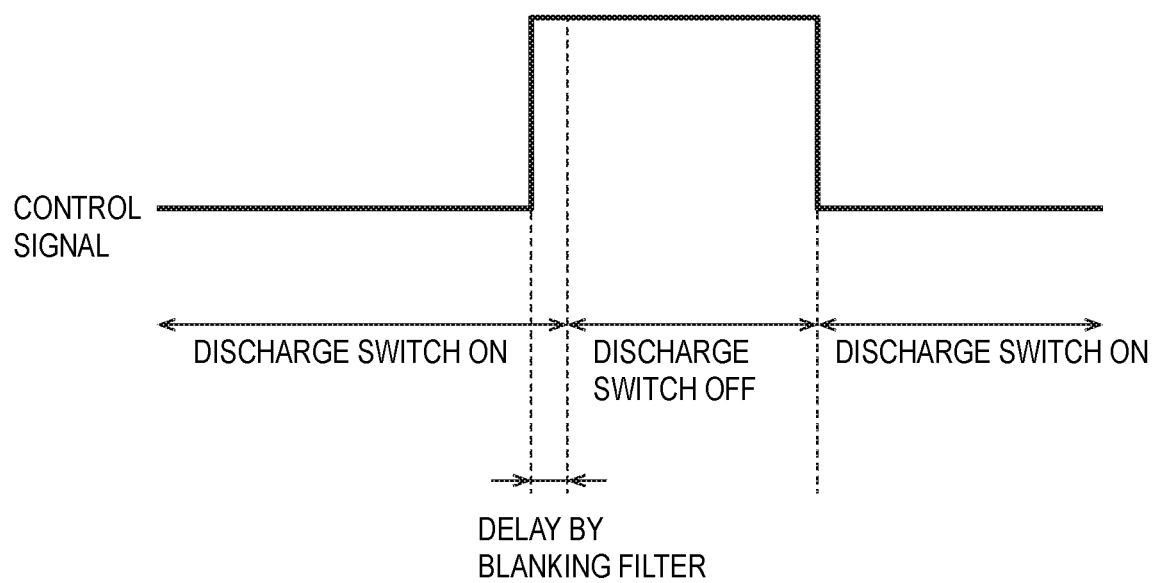
FIG. 2 is a diagram illustrating a relation between a control signal for a semiconductor switching element and ON/OFF states of a discharge switch.

FIG. 2 illustrates a relation between a control signal of the semiconductor switching element Q and ON/OFF states of the discharge switch 173. The discharge switch 173 is turned off with a delay from rising of the control signal. The discharge switch 173 is on and the voltage at the node N1 is suppressed for a first time (the delay time of the delay device 171) after the discharge switch 173 receives an ON control signal. The first time is, for example, a blanking time until the collector voltage sufficiently drops at a turn-on time of the semiconductor switching element Q. As explained above, when supply of an ON driving signal to the semiconductor switching element Q is started, the collector voltage is high. Usually, the collector voltage is equal to or higher than the threshold voltage used in the comparison circuit 130. Therefore, when the collector voltage appears in the node N1 at the turn-on operation start time of the semiconductor switching element Q, the comparison circuit 130 erroneously detects an overcurrent. When a signal indicating the erroneous detection of the overcurrent is input to the control circuit 110 via the noise removal filter 120 explained below, a protection function in the control circuit 110 operates. When the protection function operates, for example, a control signal indicating OFF is output from the control circuit 110 to the driver circuit 180 and a driving signal indicating OFF is supplied from the driver circuit 180 to the semiconductor switching element Q. Consequently, the semiconductor switching element Q is turned off. Note that a configuration is also possible in which a signal indicating erroneous detection of an overcurrent is directly input to the driver circuit 180 and the driver circuit 180 outputs an OFF driving signal to the gate G of the semiconductor switching element Q.

Erroneous detection at a turn-on time can be prevented if the blanking time (the first time) is set long. However, when an overcurrent actually occurs, detection of the overcurrent is delayed by more than an allowable time. Therefore, it is necessary to set the blanking time to appropriate length that can prevent erroneous detection at the turn-on time and, at the same time, does not exceed the allowable time (a first threshold time).

Note that, at an evaluation test time in this embodiment, the control circuit 110 or the driver circuit 180 are set such that the protection function explained above does not operate when erroneous detection of an overcurrent occurs in the comparison circuit 130.

The delay time of the delay device 171 (the blanking time or the first time) can be adjusted or changed according to a delay time parameter (a blanking time parameter or a fourth parameter) stored in the memory 190. The delay device 171 reads the blanking time parameter stored in the memory 190 and sets the delay time according to the blanking time parameter. A value of the blanking time parameter stored in the memory 190 can be adjusted by the control circuit 110.

When detecting that the high level signal (the first signal) is output from the comparator 132 for at least a certain time (a second time) or more, the noise removal filter 120 (the second filter) generates an output signal (a second signal) including a pulse (an abnormal signal) indicating occurrence of an overcurrent in the semiconductor switching element Q.

The noise removal filter 120 includes a delay device 121 and an AND circuit (an AND logic circuit) 122. A comparison result signal (the high level signal or the low level signal), which is the first signal, from the comparison circuit 130 is input to the delay device 121. The delay device 121 delays the comparison result signal by a preset time (delay time) and outputs the delayed signal. The comparison result signal from the comparison circuit 130 and the comparison result signal delayed by the delay device 121 are input to the AND circuit 122 and a logical product of both the signals is output from the AND circuit 122. The AND circuit 122 outputs the high level signal when both of the signals are at a high level and outputs the low level signal when at least one of the signals is at a low level. Consequently, the AND circuit 122 outputs the abnormal signal as the high level signal only when the high level comparison result signal is input from the comparison circuit 130 for a fixed time (the delay time or the second time) or more. Consequently, even if a noise signal in a short time is temporarily added to the comparison result signal, the abnormal signal is prevented from being output from the AND circuit 122.

The delay time in the delay device 121 of the noise removal filter 120 can be adjusted or changed according to the delay time parameter (a noise removal time parameter) stored in the memory 190. The delay device 121 reads the noise removal time parameter from the memory 190 and sets the delay time according to the noise removal time parameter. A value of the noise removal time parameter stored in the memory 190 can be adjusted by the control circuit 110.

When the high level comparison result signal (the abnormal signal or the second signal) is input from the noise removal filter 120, the control circuit 110 determines occurrence of an overcurrent and executes a protection function for performing control for turning off the semiconductor switching element Q. However, the control circuit 110 may be set not to perform the protection operation at the evaluation test time in this embodiment explained below even if the abnormal signal is input to the control circuit 110.

By performing an operation of an evaluation test according to this embodiment, the control circuit 110 adjusts or determines the blanking time parameter of the blanking filter 175, the threshold voltage parameter of the comparison circuit 130, the noise removal time parameter of the noise removal filter 120, and the driver parameter of the driver circuit 180.

More specifically, the control circuit 110 adjusts these parameters such that occurrence of an overcurrent is prevented from being erroneously detected by the comparison circuit 130 because of ringing of the collector voltage of the semiconductor switching element Q at the turn-on time and, when an overcurrent occurs, an allowable time allowed from the occurrence of the overcurrent until detection of the overcurrent (until a protecting operation start) is not exceeded.

Figure 3:
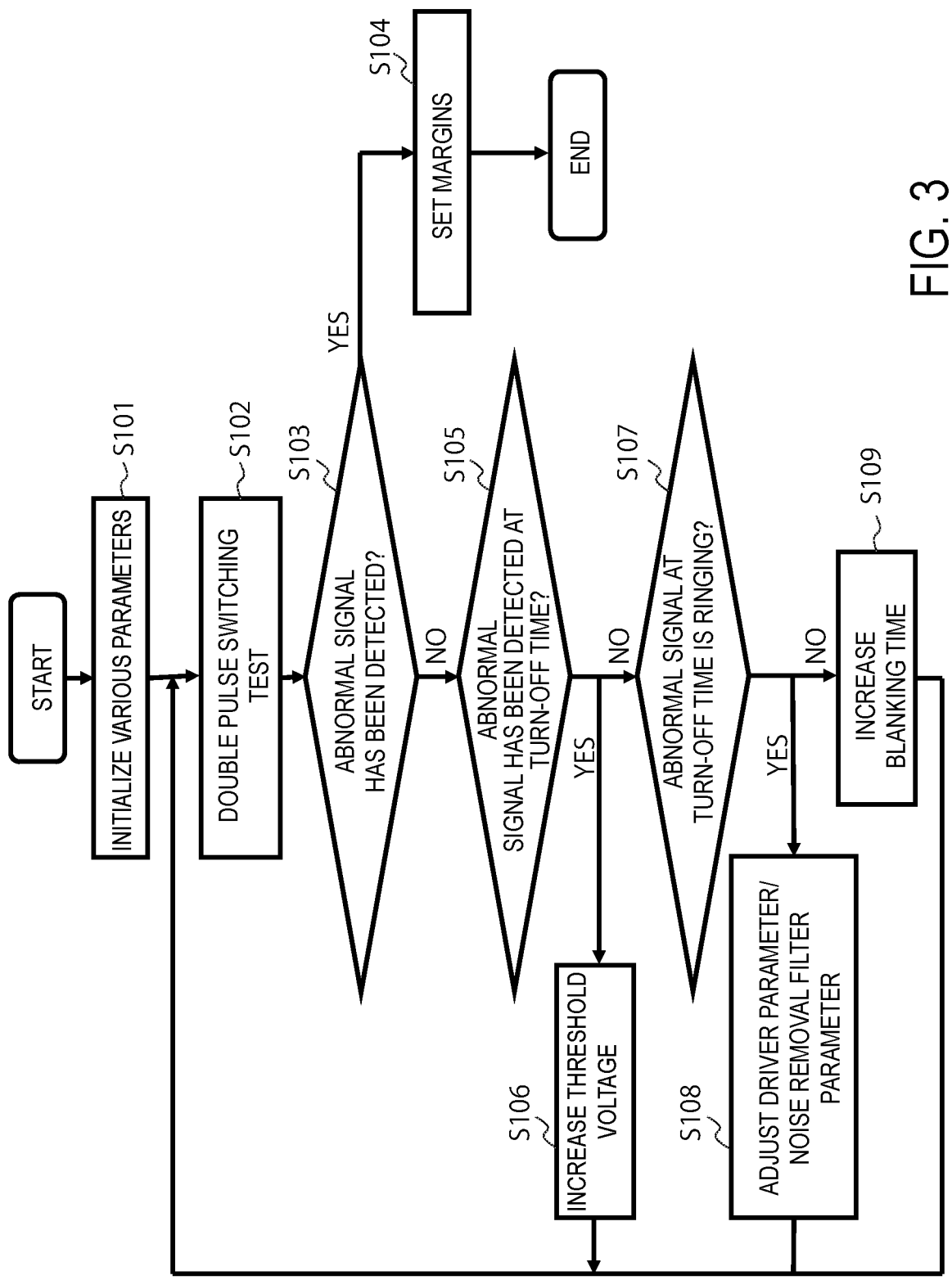
FIG. 3 is a flowchart of an example of an operation of an evaluation test performed by a control circuit.

FIG. 3 is a flowchart of an example of the operation of the evaluation test performed by the control circuit 110. The operation of this flowchart may be performed by causing a computer to execute a program. In the evaluation test, it is assumed that a protection operation function (a function such as a forced stop of the semiconductor switching element Q) performed when an abnormal signal (a pulse indicating occurrence of an overcurrent) is output from the noise removal filter 120 is turned off.

The control circuit 110 sets the various parameters, specifically, the blanking time parameter, the threshold voltage parameter, the noise removal time parameter, and the driver parameter stored in the memory 190 to initial values (S101).

In this example, the control circuit 110 sets the blanking time parameter, the threshold voltage parameter, and the noise removal time parameter respectively to 0. However, the control circuit 110 may set the parameters to any values other than 0. It is assumed that the driver parameter is set to a parameter indicating that a waveform of a control signal (a PWM signal) is directly output as a driving signal.

The control circuit 110 generates a control signal for test and inputs the generated signal to the gate driver 100. The control signal for test is a control signal for a double pulse switching test in this example and is a double pulse signal including two times of an ON control signal (pulse). Note that a first pulse in the control signal is longer than a second pulse. The control signal for test is not limited to the double pulse signal and may be a signal including only one pulse (a single pulse signal).

The control circuit 110 monitors an output signal of the noise removal filter 120 and checks whether an abnormal signal indicating occurrence of an overcurrent has been detected (S103). When the abnormal signal has not been detected, the control circuit 110 sets margins respectively in the blanking time parameter, the threshold voltage parameter, and the noise removal time parameter (S104) and ends the processing. As an example of the setting of the margins, a value of at least one of these parameters is increased by a predetermined ratio or increased by a predetermined value. The predetermined ratio and the predetermined value may be different for each of the parameters.

When the abnormal signal has not been detected, the control circuit 110 checks whether the abnormal signal has been detected at a turn-off time of the semiconductor switching element Q (S105). That is, a time point at the end of the first or second pulse of the double pulse signal corresponds to the turn-off time. The control circuit 110 checks whether the abnormal signal has been detected at this time point or in a range including this time point. When the abnormal signal has been detected, the control circuit 110 increases a value of the threshold voltage parameter (S106). That is, the control circuit 110 increases the threshold voltage of the comparison circuit 130. As a method of the increase, a fixed value may be added to a current threshold voltage or the current threshold voltage may be increased by a predetermined ratio.

When the abnormal signal has not been detected at the turn-off time, the control circuit 110 determines that an abnormal signal is present at the turn-on time and subsequently checks whether the abnormal signal at the turn-on time is ringing. That is, a time point at the head of the first or second pulse of the double pulse signal corresponds to the turn-on time. The control circuit 110 checks whether ringing of the abnormal signal has occurred later than the first threshold time from this time point. For example, when a pulse having fixed density or more is present in a time direction, the control circuit 110 may determine that ringing has occurred. The density may be calculated based on the number of pulses included in a fixed time range. Alternatively, when one or more pulses are present later than the first threshold time and an end time point of a pulse of a control signal corresponding to the pulse is not included in the pulse (that is, the threshold voltage is properly set), the control circuit 110 may determine or regard that the ringing of the abnormal signal has occurred. When the abnormal signal is not ringing, the control circuit 110 increases the blanking time (S109). As a method of the increase, a fixed value may be added to a current blanking time or the current blanking time may be increased by a predetermined ratio. However, an upper limit value of the blanking time is the first threshold time.

When the abnormal signal at the turn-on time is ringing, the control circuit 110 adjusts at least one of the driver parameter and the noise removal time parameter (S108).

As an example, first, the control circuit 110 increases the noise removal time parameter, that is, increases the delay time of the delay device 121 in the noise removal filter 120. As a method of the increase, a fixed value may be added to a current noise removal time parameter value or the current noise removal time parameter value may be increased by a predetermined ratio. Thereafter, the control circuit 110 returns to step S102 and, when proceeding to step S108 again, increases the noise removal time parameter again. Then, the control circuit 110 increases the value of the noise removal time parameter until the noise removal time parameter value reaches an upper limit value (a second threshold time). If the value of the noise removal time parameter is set longer than a time (a third time) in which the high level signal (the first signal) is output from the comparator 132 because of the ringing of the voltage that occurs at the turn-on time of the semiconductor switching element Q, the ringing of the abnormal signal disappears.

However, when the noise removal time parameter value has reached the upper limit value, since the ringing of the abnormal signal cannot be eliminated by the adjustment of the noise removal time parameter, subsequently, the control circuit 110 adjusts the driver parameter. The driver parameter is a parameter for determining a waveform of a driving signal at the time when the driving signal is generated from a control signal input to the driver circuit 180. The control circuit 110 adjusts the driver parameter such that a waveform of a driving signal capable of suppressing ringing at the turn-on time of the semiconductor switching element Q can be obtained. For example, the control circuit 110 sets one of a plurality of driver parameter candidates and returns to step S102 and, when proceeding to step S108 again, sets another driver parameter candidate. The control circuit 110 switches a candidate of the driver parameter until a driver parameter for suppressing or eliminating the ringing of the abnormal signal is found, that is, a waveform of a driving signal capable of suppressing ringing at the turn-on time of the semiconductor switching element Q is obtained. Details of the driver parameter are explained below.

In the example explained above, the noise removal time parameter is more preferentially changed than the driver parameter. However, other methods are also possible. For example, the value of the noise removal time parameter is gradually increased from the initial value for each of candidates of the driver parameter to find a noise removal time parameter value at which ringing does not occur. However, even in this case, the value of the noise removal time parameter should not exceed the upper limit value. A set of the noise removal time parameter and a driver parameter candidate in which the value of the noise removal time parameter is included in a desired range is specified. Values of the noise removal time parameter and the driver parameter candidate in the specified set are determined as values of the noise removal time parameter and the driver parameter and these parameters are adjusted to the determined values. This method is effective when there is a range of a preferred value of the noise removal time parameter.

The operation of the evaluation test explained above is explained in detail below using a specific example.

First, various waveforms obtained when a double pulse signal is input when it is assumed for explanation that ringing of the collector voltage of the semiconductor switching element Q is absent are explained.

Figure 4:
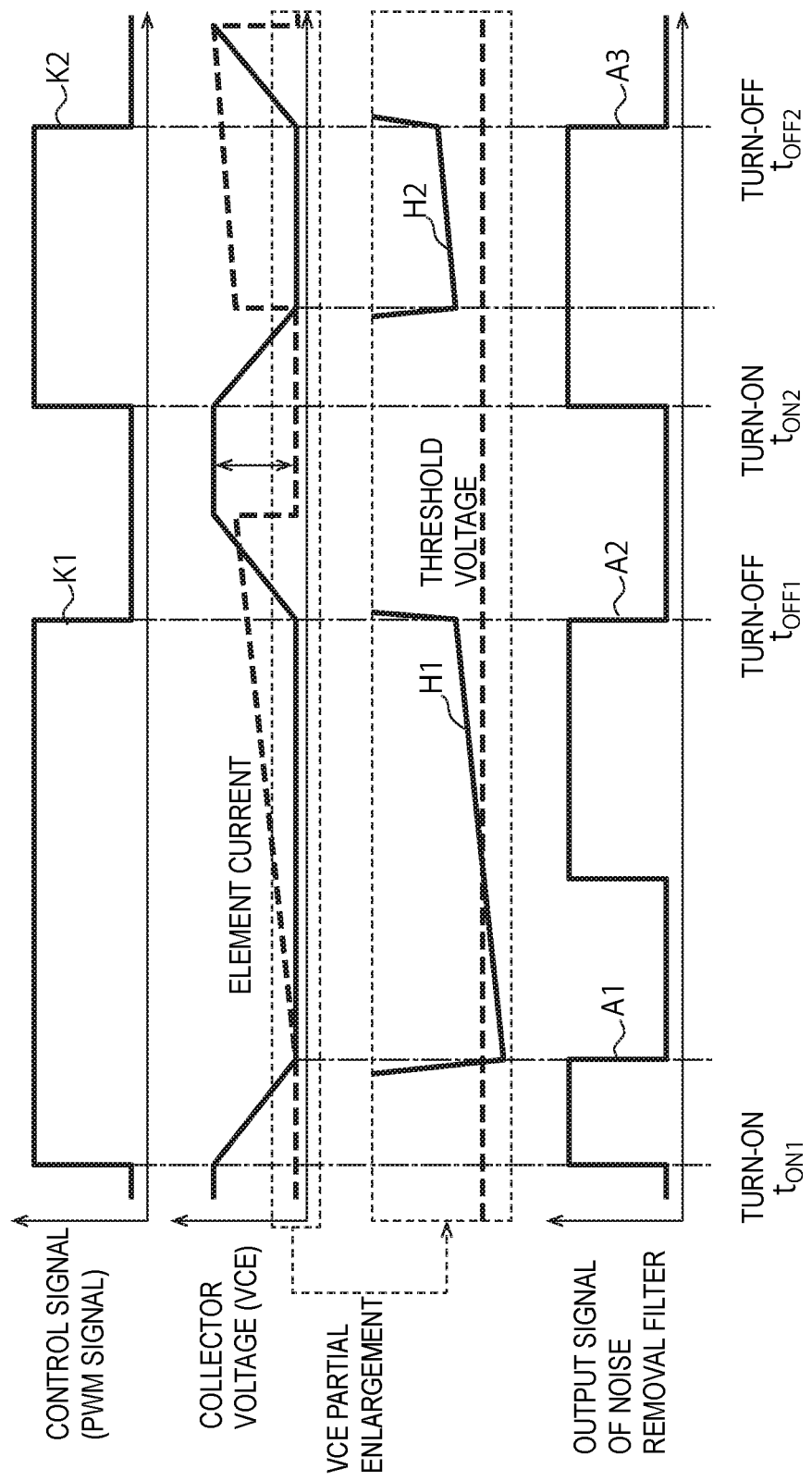
FIG. 4 is a diagram illustrating an example in which a double pulse test for, when it is assumed that ringing of the semiconductor switching element is absent, inputting a control signal including two times of ON pulses of the semiconductor switching element was performed.

FIG. 4 illustrates an example of various waveforms obtained when a double pulse test for inputting a control signal including two times of pulses indicating ON of the semiconductor switching element Q is performed when it is assumed that ringing of the collector voltage of the semiconductor switching element Q is absent.

It is assumed that the values of the threshold voltage parameter, the blanking time parameter, and the noise removal time parameter are respectively set to the initial values (in this example, 0) and the driver parameter is also set to the initial value (the value indicating that the control signal is directly output as the driving signal). An example of waveforms of the control signal (the PWM signal or the first signal), the collector voltage/the collector current (an element current), and the output signal (the second signal) of the noise removal filter 120 is illustrated. A partially enlarged view of the waveform of the collector voltage is also illustrated. A first pulse K1 (a first-time first pulse) in the control signal is longer than a second pulse K2 (a second-time first pulse). The horizontal axis indicates time (t) and the vertical axis indicates amplitude. Note that, in the evaluation test, it is assumed that devices other than the semiconductor switching element Q are not operated and a noise signal is not input.

A pulse A1 of a first abnormal signal in an output signal of the noise removal filter 120 is generated because the blanking time is inappropriate (for example, small).

A pulse A2 of a second abnormal signal in the output signal is generated because a threshold voltage is inappropriate (for example, small).

A pulse A3 of a third abnormal signal in the output signal is one pulse obtained by connecting two pulses. More specifically, the pulse A3 is one pulse obtained by combining a pulse due to the inappropriate blanking time and a pulse due to the inappropriate threshold voltage. A reason for this is explained below. When the first pulse K1 of the control signal ends, the collector voltage gradually rises. Although the collector current gently rises at a gradient determined by a parasitic inductor of the semiconductor switching element Q, the collector current stops when the semiconductor switching element Q is completely turned off. An electric current is accumulated in the parasitic inductor of the semiconductor switching element Q. When the second pulse K2 of the control signal is input, the collector voltage drops according to turn-on of the semiconductor switching element Q and the electric current starts to rise from a state in which the electric current is accumulated. Therefore, the voltage at the node N1 rises (see an enlarged partial waveform H2 of the collector voltage) earlier than a rise of a voltage at an input time of the pulse K1 of the first control signal (see an enlarged partial waveform H1 of the collector voltage). Consequently, a pulse has a shape extended to the left side such that a rising edge of the pulse (see the pulse A2) in the case of the inappropriate threshold voltage moves to the left side. The pulse is combined with a pulse (see the pulse A1) in the case of the inappropriate blanking time to be the pulse A3.

Figure 5:
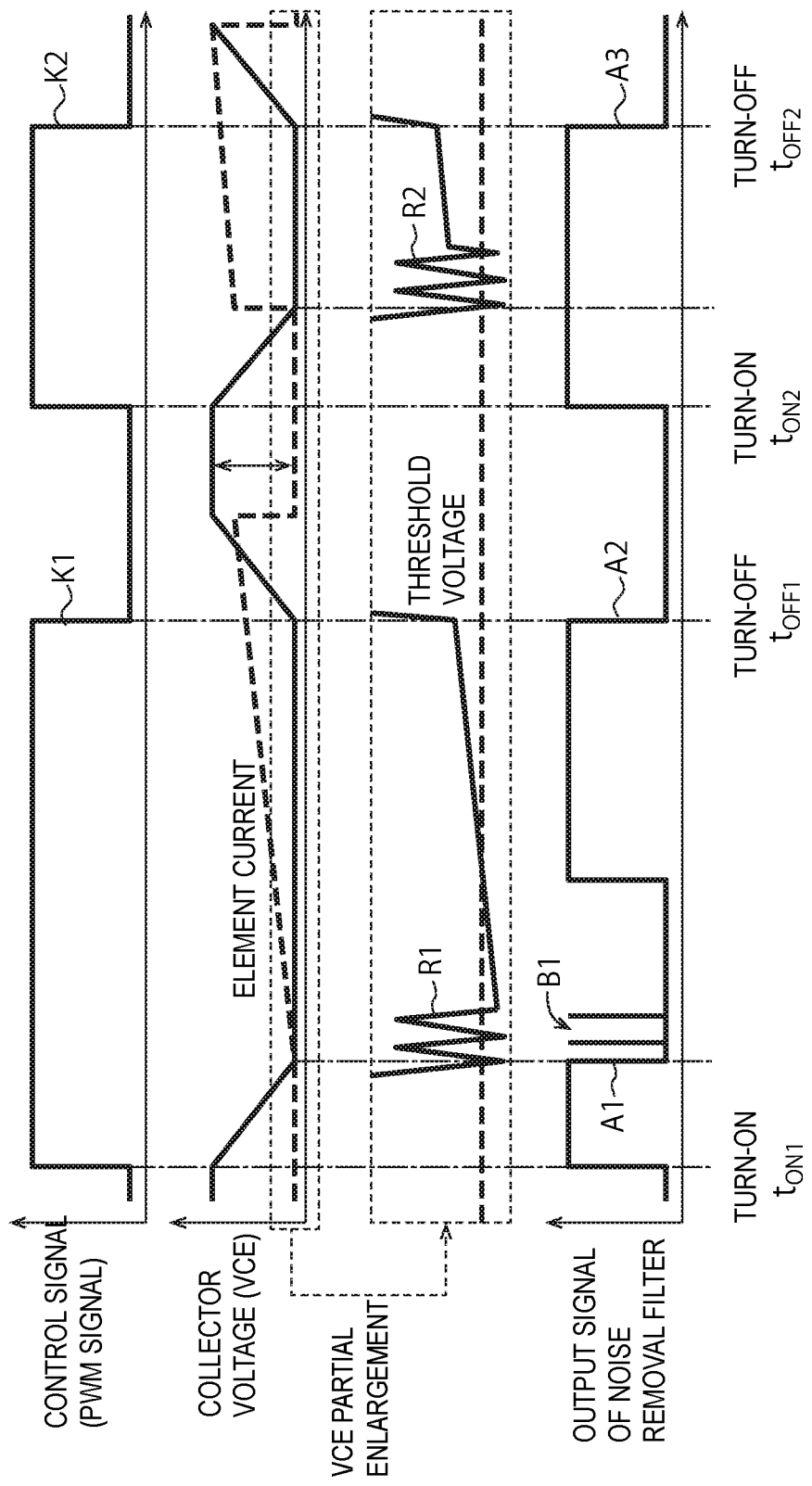
FIG. 5 is a diagram illustrating an example of a case in which ringing of a collector voltage in the semiconductor switching element is present under the same condition as the condition in FIG. 4.

FIG. 5 illustrates an example of a case in which ringing of the collector voltage is present in the semiconductor switching element Q under the same condition as the condition in FIG. 4. As illustrated in a partially enlarged view of the collector voltage, ringing R1 and ringing R2 occur after the semiconductor switching element Q is turned on according to the pulses K1 and K2 of the control signal. A pulse B1 of an abnormal signal (ringing of the abnormal signal) is generated in an output signal of the noise removal filter because of the ringing R1. A pulse of the abnormal signal (ringing of the abnormal signal) is generated in the output signal of the noise removal filter because of the ringing R2 as well. However, the pulse is included in the pulse A3 in this example.

A specific example in which the various parameters are adjusted according to the processing of the flowchart of FIG. 3 when the output signal of the noise removal filter 120 illustrated in FIG. 5 is output is explained below.

As illustrated in FIG. 5, since the abnormal signal is included in the output signal of the noise removal filter 120, the control circuit 110 proceeds to step S105 through step S103. In step S105, the control circuit 110 checks whether an abnormal signal has been detected at the turn-off time. The pulse A2 of the abnormal signal is present at the turn-off time corresponding to the end of the pulse K1 of the control signal. In this example, the end of the pulse A2 of the abnormal signal coincides with the end of the pulse K1 of the control signal. However, it could occur that the end of the pulse A2 of the abnormal signal is a time later than the end of the pulse K1 of the control signal. The control circuit 110 proceeds to step S106 and increases the value of the threshold voltage parameter. A flow of steps S102, S103, S105, and S106 is repeated one or a plurality of times until the abnormal signal is no longer detected at the turn-off time in step S105.

Figure 6:
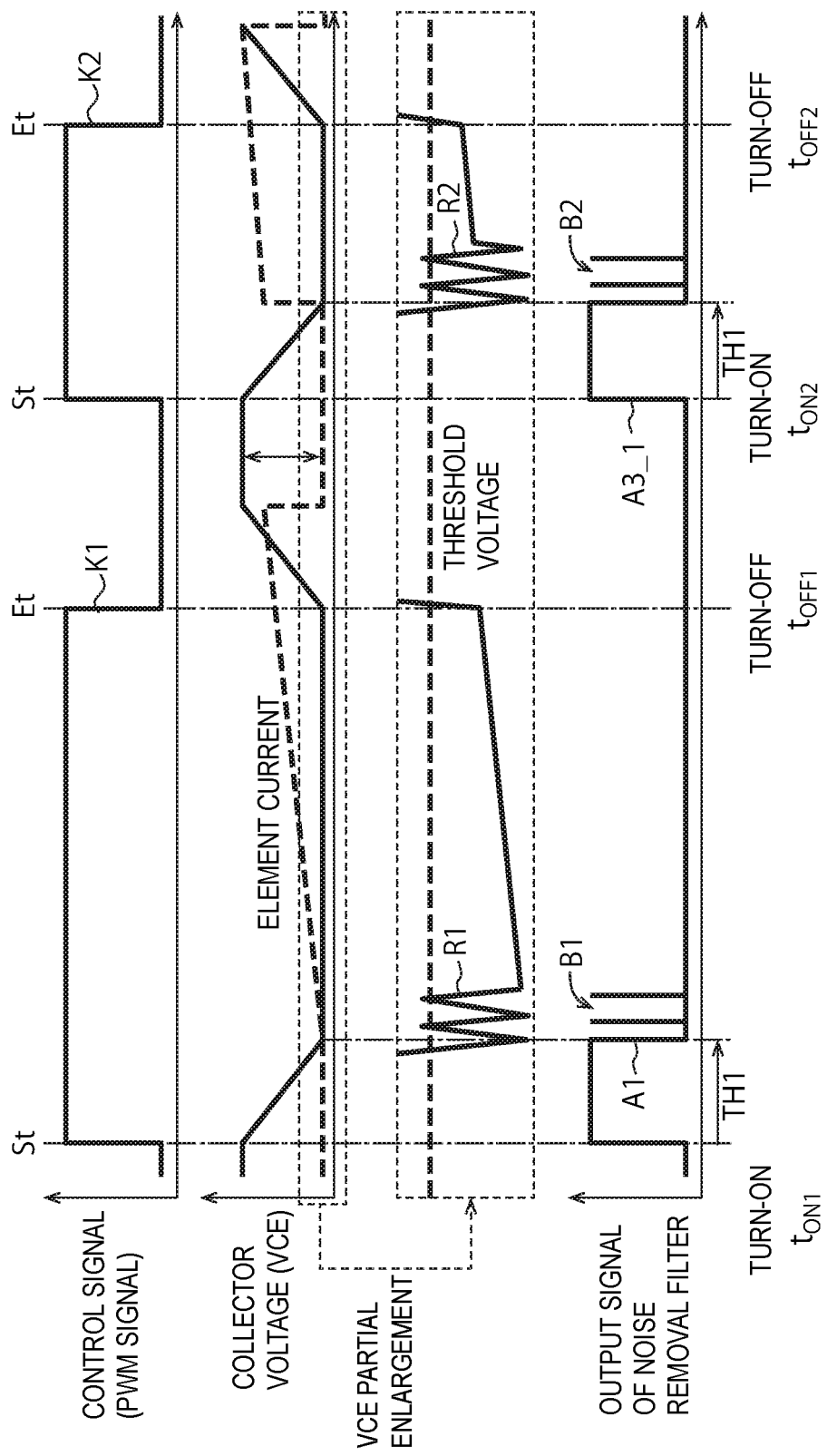
FIG. 6 is a diagram illustrating an example of various waveforms in the case in which an abnormal signal has no longer been detected at a turn-off time because a threshold voltage parameter was increased.

FIG. 6 illustrates an example of various waveforms in the case in which an abnormal signal has no longer been detected at the turn-off time because the threshold voltage parameter is increased. The pulse A2 of the abnormal signal present in the output signal illustrated in FIG. 5 has disappeared. In the pulse A3 of the abnormal signal present in the output signal illustrated in FIG. 5, a portion generated because of the threshold voltage disappears. The pulse A3 changes to a pulse A3_1. A pulse B2 of the abnormal signal (ringing of the abnormal signal) is detected in the output signal of the noise removal filter because of the ringing R2.

When the output signal of the noise removal filter changes to the output signal illustrated in FIG. 6, in the flowchart of FIG. 3, the control circuit 110 determines "NO" in step S105 and proceeds to step S107. In step S107, the control circuit 110 checks whether the abnormal signal at the turn-on time is ringing. Specifically, when a pulse is present in a section later than a threshold time TH1 (a first threshold time) from a start time point St of a pulse of the control signal and earlier than an end time point Et of the pulse of the control signal, since an environment in which input of a noise signal is absent is assumed, the control circuit 110 determines or regards that the abnormal signal at the turn-on time is ringing. The threshold time TH1 is, for example, a maximum value of a time allowed as a blanking time. The start time point St may be a time point of a start edge (here, a rising edge) of the pulse or may be another time point (for example, a time point immediately before or immediately after rising) if the time point is a time point for specifying a start of the pulse. Similarly, the end time point Et may be a time point of an end edge (here, a falling edge) of the pulse or may be another time point (for example, a time point immediately before or immediately after falling) if the time point is a time point for specifying an end of the pulse.

In the example illustrated in FIG. 6, the pulse B1 of the output signal is present later than the threshold time TH1 from the start time point St of the pulse K1 of the control signal and the position of the pulse B1 is earlier than the end time point Et of the pulse K1 of the control signal. Accordingly, the control circuit 110 determines that ringing of the abnormal signal has occurred at the turn-on time of the semiconductor switching element Q corresponding to the pulse K1. Similarly, the pulse B2 of the output signal is present later than the threshold time TH1 from the start time point St of the pulse K2 of the control signal and the position of the pulse B2 is earlier than the end time point Et of the pulse K2 of the control signal. Accordingly, the control circuit 110 determines that ringing of the abnormal signal has occurred at the turn-on time of the semiconductor switching element Q corresponding to the pulse K2.

The control circuit 110 adjusts at least one of the driver parameter and the noise removal time parameter. Here, the control circuit 110 preferentially increases the value of the noise removal time parameter. A flow of steps S102, S103, S105, S107, and S108 is repeated once or a plurality of times until the abnormality signal is no longer detected at the turn-off time in step S107. However, when the noise removal time parameter has reached the upper limit value (the second threshold time), that is, when the delay time of the delay device 121 of the noise removal filter has reached the upper limit value, the control circuit 110 changes the value of the driver parameter in a state in which the value of the noise removal time parameter is fixed at the upper limit value. The driver parameter indicates a method of determining a waveform of a driving signal when the driving signal is generated from a control signal. The flow of step S102, S103, S105, S107, and S108 is repeated once or a plurality of times until ringing of the abnormal signal is no longer detected at the turn-on time in step S107. When the ringing of the abnormal signal is no longer detected at the turn-on time in step S107, the control circuit 110 proceeds to step S109.

Figure 7:
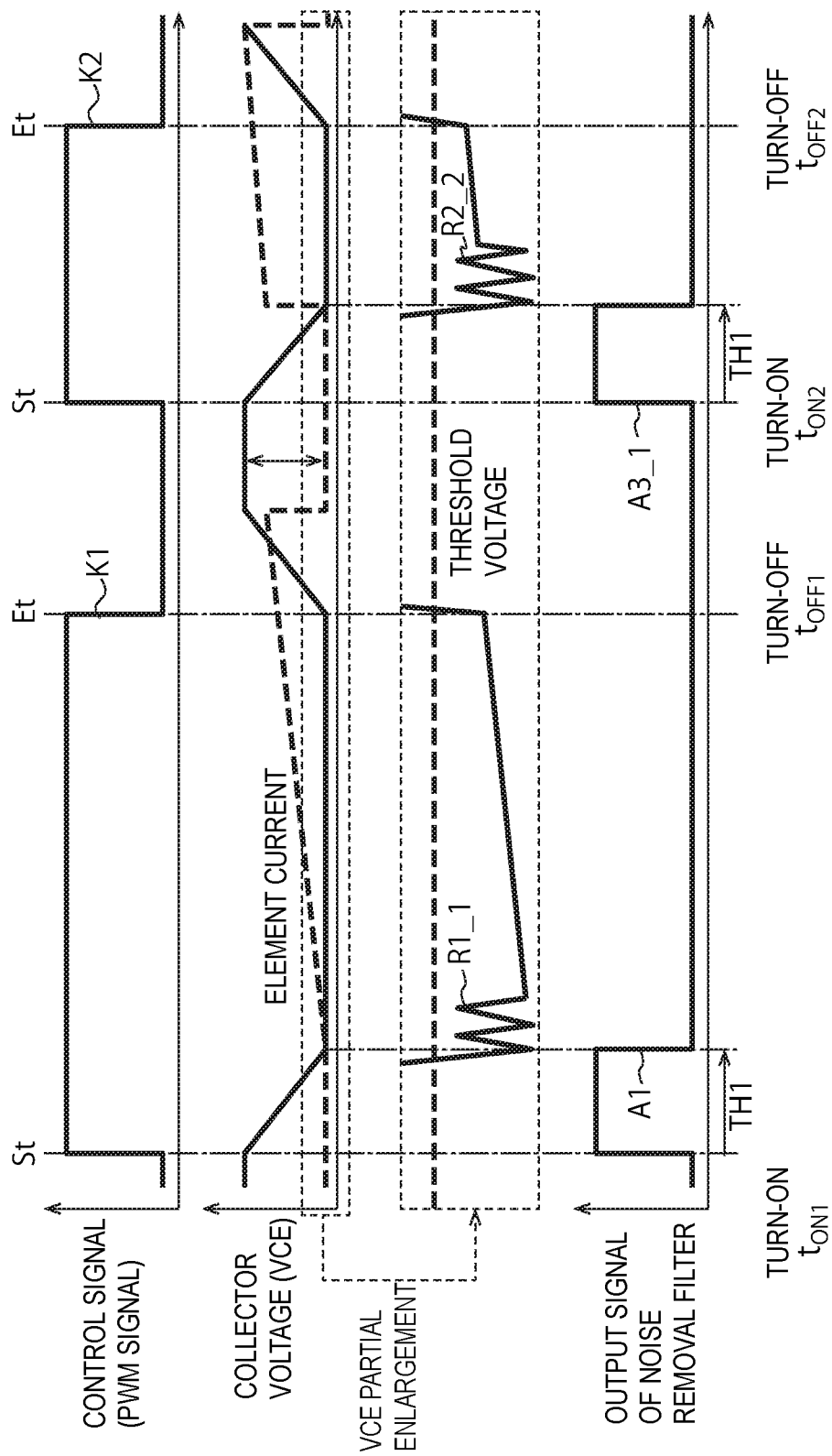
FIG. 7 is a diagram illustrating an example of various waveforms in the case in which ringing has disappeared from an output signal of a noise removal filter illustrated in FIG. 6.

FIG. 7 illustrates an example of various waveforms in the case in which the ringing disappears from the output signal of the noise removal filter illustrated in FIG. 6. Ringing of an abnormal signal is absent and ringing R1_1 and ringing R2_2 of the collector voltage are suppressed compared with FIG. 6. A suppression effect of the ringing R1_1 and the ringing R2_2 of the collector voltage is due to a change of the driver parameter. Otherwise, FIG. 7 is the same as FIG. 6. An output signal of the noise removal filter includes only the pulse A1 and the pulse A3_1 as an abnormal signal. Start time points and end time points of both of the pulse A1 and the pulse A3_1 are kept within the threshold time TH1 from the start time point St of the pulses K1 and K2 of a control signal corresponding to the start time points and the end time points.

In step S109, the control circuit 110 determines to increase the value of the blanking time parameter. That is, the control circuit 110 determines to increase the value of the blanking time parameter when a start time point and an end time point of a pulse of an output signal is kept within the threshold time TH1 from the start time point St of the pulse of the control signal. A flow of steps S102, S103, S105, S107, and S109 is repeated once or a plurality of times until the abnormal signal is no longer detected in step S103. The positions of rising edges of the pulses A1 and A3_1 move in the time direction and a pulse width is narrowed according to the increase in the blanking time parameter (according to an increase in the delay time of the delay device 171). When the rising edges of the pulses A1 and A3_1 move to the positions of falling edges of the pulses A1 and A3_1, the pulses A1 and A3_1 disappear.

Figure 8:
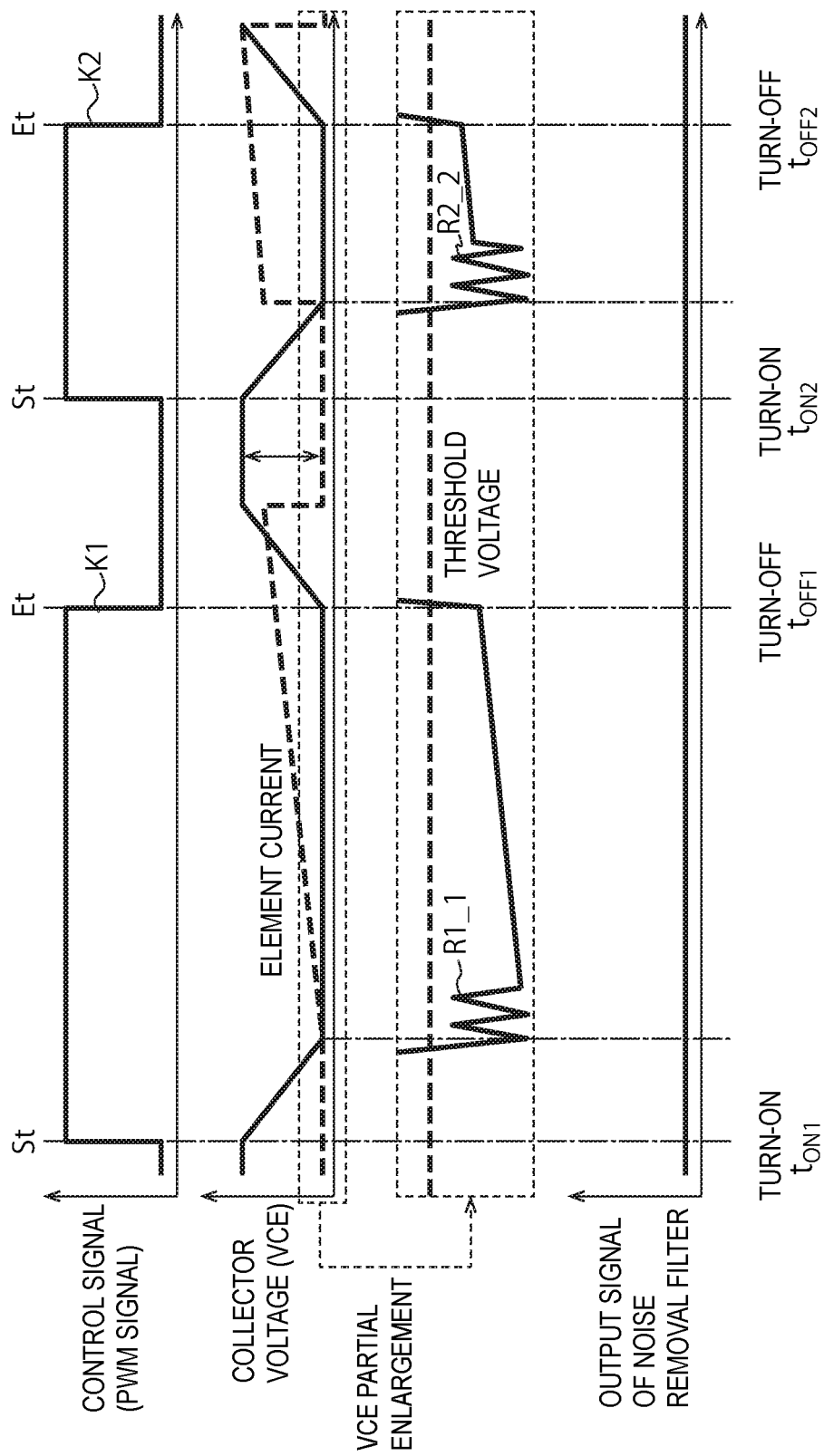
FIG. 8 is a diagram illustrating an example of various waveforms in the case in which a pulse has disappeared from the output signal of the noise removal filter illustrated in FIG. 7.

FIG. 8 illustrates an example of various waveforms in the case in which the pulses A1 and A3_1 disappear from the output signal of the noise removal filter illustrated in FIG. 7. An abnormal signal is absent in the output signal of the noise removal filter.

When determining in step S103 that an abnormal signal is not detected from the output signal of the noise removal filter 120, the control circuit 110 sets margins respectively in the values of the blanking time parameter, the threshold voltage parameter, and the noise removal time parameter determined in steps S106, S108, and S109. The values of these parameters after the margin setting are stored in the memory 190. The delay device 171, the DAC 131, and the delay device 121 may respectively read the blanking time parameter, the threshold voltage parameter, and the noise removal time parameter from the memory 190 and perform setting on the insides of the delay device 171, the DAC 131, and the delay device 121. Then, the control circuit 110 ends the processing of the flowchart.

After the setting of the various parameters is completed in the test evaluation explained above, another device or the like connected to the semiconductor switching element Q may be operated, the double pulse test may be performed again, and, if the noise removal time parameter has not reached the upper limit, setting of the noise removal time parameter may be performed. Consequently, it is possible to perform parameter setting for the noise removal filter 120 considering noise from the outside as well. Examples of the other device connected to the semiconductor switching element Q include a load device and another semiconductor switching element connected to the collector or the emitter of the semiconductor switching element Q.

The operation of the flow illustrated in FIG. 3 is an example and can be variously modified. For example, when adjustment of a threshold voltage has been completed in advance, an operation of a flow in which steps S105 and S106 are omitted may be performed. Although the margins are set in the flow of FIG. 3, the setting of the margins may be omitted.

Note that the waveforms illustrated in FIGS. 4 to 8 are positive logic signal waveforms. However, negative logic waveforms can be processed in the same manner.

A method of adjusting the driver parameter is explained in detail below with reference to FIGS. 9 to 11.

Figure 9:
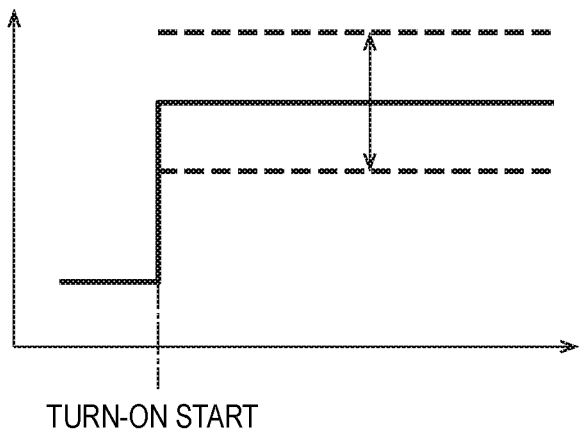
FIG. 9 is a diagram illustrating an adjustment example of a driver parameter by a constant driving scheme.

FIG. 9 illustrates an adjustment example of the driver parameter by a constant driving scheme. The constant driving scheme corresponds to a first scheme for generating a driving signal by increasing or reducing a driving current (a gate current) according to a pulse included in a control signal from the control circuit 110. Candidates of a plurality of driving signals are present. Any one of the driving currents is optionally selected. All of the driving currents are electric currents with which a gate voltage of the semiconductor switching element Q is equal to or larger than a threshold voltage. The control circuit 110 changes the value of the driver parameter to adjust a driving current of a driving signal that the control circuit 110 causes the driver circuit 180 to generate. Note that the amplitude of the driving signal generated by the driver circuit 180 is fixed.

For example, if the value of the driver parameter is "1", the driving signal may be generated by a driving current with which amplitude larger than the amplitude of a control signal by one stage can be obtained. If the value of the driver parameter is "2", the driving signal may be generated by a driving current with which amplitude larger than the amplitude of the control signal by two stages can be obtained. If the value of the driver parameter is "−1", the driving signal may be generated by a driving current with which amplitude smaller than the amplitude of the control signal by one stage can be obtained. In this case, driving current values at the stages are decided in advance. The driving current values at the stages are stored on the inside of the driver circuit 180 or in the memory 190 in advance. Alternatively, the driver parameter may directly indicate a value of the driving current of the driving signal. The number of driving currents that can be output from the driver circuit 180 may be optional as long as a plurality of different driving currents can be output. When adjusting the value of the driver parameter, the control circuit 110 may select a driving current in preset order out of one or more driving currents or may select a driving current at random. When adjusting the value of the driver parameter in step S108 in the case of this scheme, every time the control circuit 110 performs the processing in step S108, the control circuit 110 selects a value of the driver parameter indicating a driving current different from the driving current used for the generation of the driving signal this time. The control circuit 110 generates a driving signal for a control signal next time with the selected value of the driver parameter.

Figure 10:
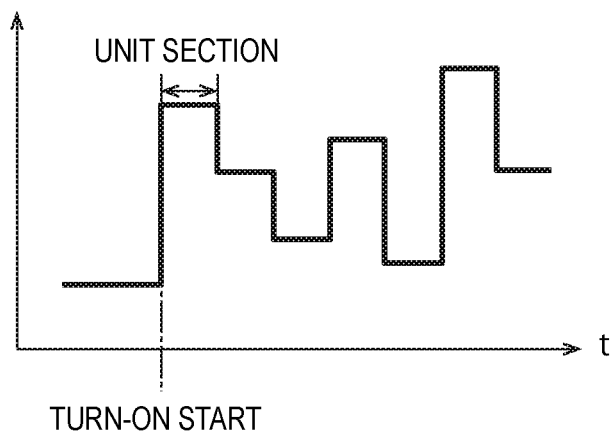
FIG. 10 is a diagram illustrating an adjustment example of the driver parameter by a random search scheme.
Figure 10:
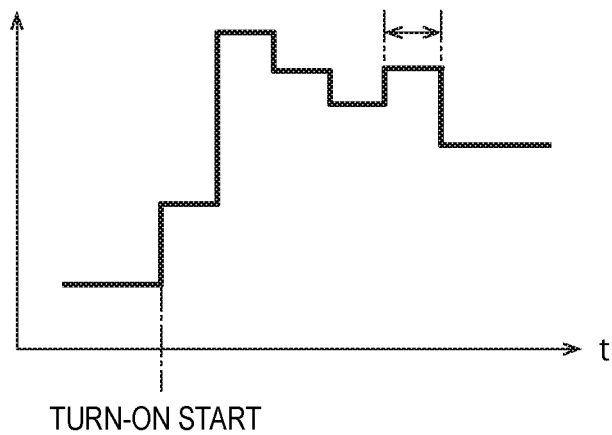

FIG. 10 illustrates an adjustment example of the driver parameter by a random search scheme. In FIG. 10, two examples of waveform patterns created by the random search scheme are illustrated. The random search scheme corresponds to a second scheme for dividing a pulse time of a control signal into a plurality of time sections and optionally setting a driving current in a range of upper and lower limits for each of the time sections. The lower limit of the driving current may be an electric current with which a gate voltage of the semiconductor switching element Q is equal to or larger than a threshold voltage. The control circuit 110 sets a value designating the driving current for each of the time sections as the driver parameter. Driving currents set in the time sections may be determined at random or may be determined based on a predetermined search algorithm. As the search algorithm, an annealing method, a hill-climbing method, or the like can be used. By using the search algorithm, it is possible to efficiently determine a waveform of a driving signal for extinguishing ringing of an abnormal signal at the turn-on time. When adjusting the value of the driver parameter in step S108 in the case of this scheme, every time the control circuit 110 performs the processing in step S108, the control circuit 110 may select a value of the driver parameter indicating a combination of driving currents different from driving currents for each of the time sections generated up to that point. The control circuit 110 generates a driving signal next time with the selected value of the driver parameter.

Figure 11:
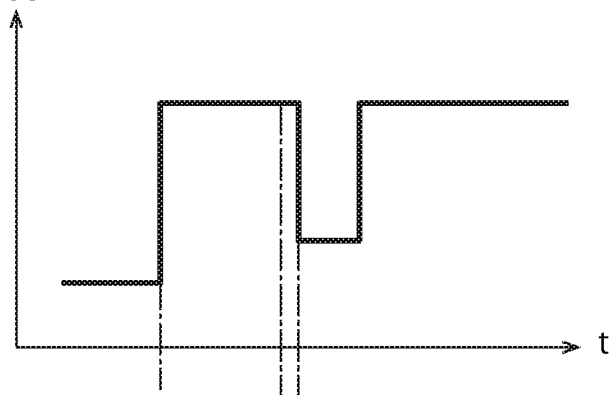
FIG. 11 is a diagram illustrating an adjustment example of the driver parameter by a template scheme.
Figure 11:
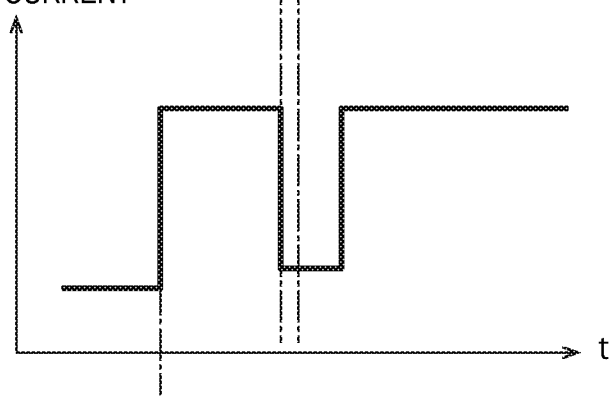

FIG. 11 illustrates an adjustment example of the driver parameter by a template scheme. A basic waveform pattern for a driving signal is decided in advance as illustrated in an upper figure of FIG. 11 and the waveform pattern is stored in the driver circuit 180 or the memory 190. The template scheme corresponds to a third scheme for setting, as the driver parameter, a value indicating an adjustment amount (a change amount) in a part of a waveform pattern serving as a template. For example, when the basic waveform pattern is a pattern including one or a plurality of recesses halfway, a value indicating a temporal position change amount of the recess is set as the driver parameter. In a lower figure of FIG. 11, an example in which the position of the recess of the basic waveform pattern illustrated in the upper figure is changed in the time direction is illustrated. A driving current in the recess may be changed other than the temporal position of the recess. The control circuit 110 changes a change amount of the basic waveform pattern and finds a waveform pattern for eliminating ringing of an abnormal signal. For example, the control circuit 110 may determine the change amount such that the recess includes a time of ringing of a voltage of the semiconductor switching element Q. A part of the waveform pattern to be changed is not limited to the recess. The basic waveform pattern is not limited to the pattern including the recess.

The example in which the basic waveform pattern is adjusted is explained in the example illustrated in FIG. 11. However, a plurality of waveform patterns may be decided in advance and the control circuit 110 may select, optionally or in predetermined order, a waveform pattern out of the plurality of waveform patterns and find a waveform pattern capable of eliminating ringing. In this case, a table that associates identifiers of waveform patterns and the waveform patterns is stored in the driver circuit 180 or the memory 190. In this case, the control circuit 110 sets, as the driver parameter, a value for identifying a waveform pattern. The driver circuit 180 selects, from the table, a waveform pattern corresponding to an identifier designated by the driver parameter and generates a driving signal having the selected waveform pattern.

As a modification, in the double pulse test, the control circuit 110 may perform parameter setting for the blanking filter 175 or the comparison circuit 130 based on the number of pulses included in an output signal of the noise removal filter 120. If the number of pulses is three or more, the control circuit 110 may determine that at least the comparison circuit 130 is improper, perform the parameter setting for the comparison circuit 130 earlier than the parameter setting for the blanking filter 175 and, when the parameter setting for the comparison circuit 130 is completed, for example, after the number of pulses decreases to two r less (ringing of an abnormal signal may not be included in the number of pulses), perform the parameter setting for the blanking filter 175.

In the configuration illustrated in FIG. 1, the control circuit 110 is connected to the gate driver 100 via a signal line. However, it is also possible to adopt a configuration in which the control circuit 110 is electrically separated from the gate driver 100.

Figure 12:
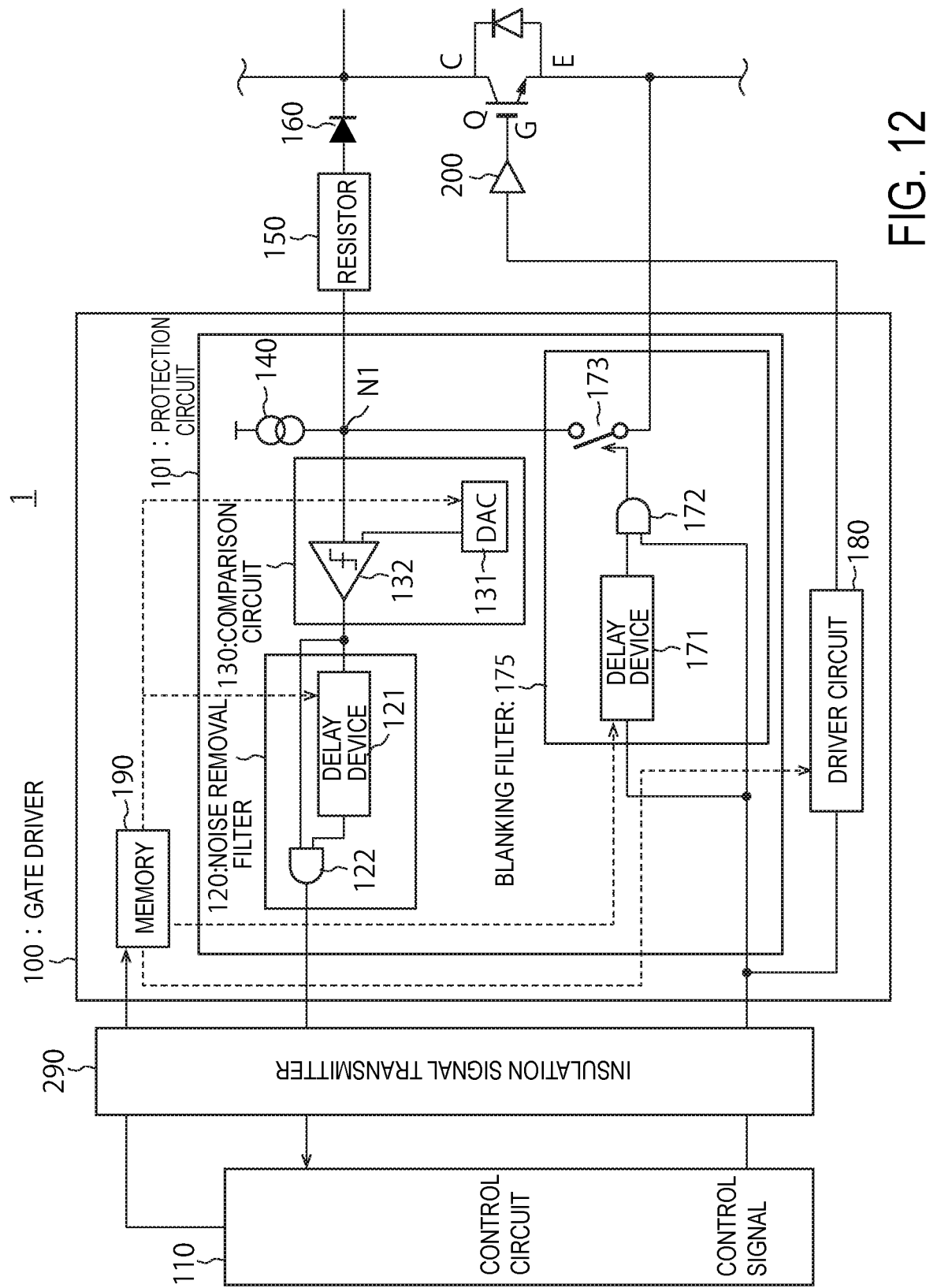
FIG. 12 is a diagram illustrating an example in which an insulation signal transmitter is provided between the control circuit and a gate driver.

FIG. 12 illustrates an example in which an insulation signal transmitter 290 is provided between the control circuit 110 and the gate driver 100. The insulation signal transmitter 290 transmits and receives signals to and from the control circuit 110 via magnetic coupling, optical coupling, capacitive coupling, or the like. Consequently, even when a reference voltage (a ground voltage or the like) on the control circuit 110 side and a reference voltage on the gate driver 100 side are different, an operation between the control circuit 110 and the gate driver 100 is possible. As an example of the insulation signal transmitter 290, at least one of a transformer, a photocoupler, and a capacitor can be used.

As explained above, according to this embodiment, by adjusting, with software control, the blanking time parameter, the threshold voltage parameter, the noise removal time parameter, and the driver parameter, it is possible to prevent an abnormal signal from being erroneously detected because of ringing of the semiconductor switching element Q at a normal operation time. An operator does not need to perform parameter adjustment while replacing elements every time the operator performs the evaluation test and can easily perform the evaluation test for the gate driver.

Figure 13:
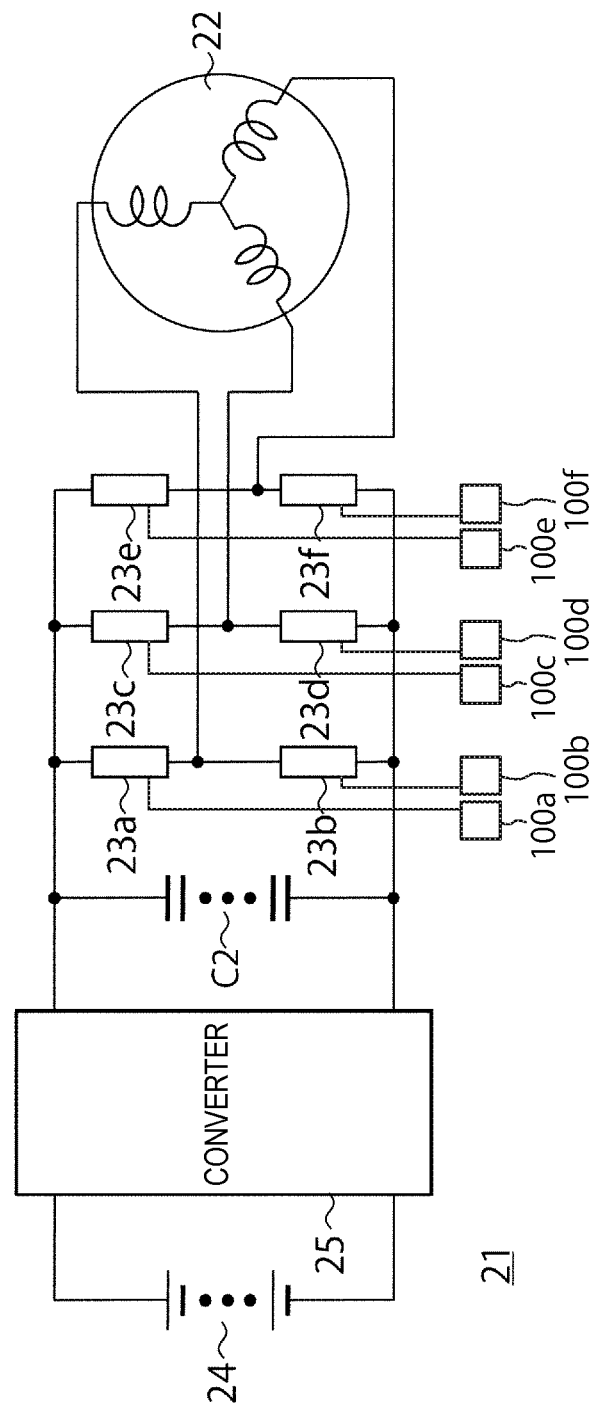
FIG. 13 is a block diagram of a power converter functioning as an electronic system in which the electronic circuitry according to the embodiment is used.

FIG. 13 is a block diagram of a power converter functioning as an electronic system in which the electronic circuitry according to this embodiment is used. A power converter 21 illustrated in FIG. 13 is a three-phase inverter that generates an AC voltage for driving the three-phase motor 22. The power converter 21 includes a plurality of arms 23a to 23f, a DC power supply 24, a converter 25, a smoothing capacitor C2, and protection processing circuits 101a to 101f. Each of the protection processing circuits 101a to 101f includes the gate driver 100, the control circuit 110, the resistor 150, the diode 160, and the buffer element 200 illustrated in FIG. 1.

Each of the plurality of arms 23a to 23f includes the semiconductor switching element (IGBT) explained in the embodiment. The arms 23a to 23f respectively perform ON or OFF operations at predetermined timings.

The converter 25 is a DC-DC converter and converts a DC voltage from the DC power supply 24 into a DC voltage having a different voltage level. The smoothing capacitor C2 smooths a voltage output from the converter 25.

Paired two arms among the arms 23a to 23f are simultaneously turned on and feed electric currents to coils corresponding thereto in the three-phase motor 22. The motor can be driven in three phases by sequentially switching the two arms that are simultaneously turned on. That is, a three-phase alternating current can be generated from the DC voltage of the DC power supply 24 by sequentially switching a pair of semiconductor switching elements that are simultaneously turned on.

The simultaneously turning on the two arms means that start timings when the two arms are turned on do not always need to coincide and the two arms only have to be simultaneously turned on in at least a part of a period.

The protection processing circuits 101a to 101f perform an evaluation test and a protection operation for the semiconductor switching elements in the plurality of arms 23a to 23f. In FIG. 13, the protection processing circuits are provided for each of the arms. However, one protection processing circuit may be provided for the plurality of arms. For example, one protection processing circuit may be provided for the arms 23a to 23f. One protection processing circuit may be provided for two arms. One protection processing circuit may be provided for three arms.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The embodiments as described before may be configured as below.

(Clauses)

Clause 1. An electronic circuitry comprising:
a comparison circuit configured to detect a first voltage at a first node relating to a first end of a semiconductor switching element and output a first signal in response to the first voltage being equal to or larger than a predetermined voltage;
a first filter including a first switch connected between the first node and a second end of the semiconductor switching element, the first filter turning on the first switch for a first time based on a control signal indicating conduction of the semiconductor switching element; and
a second filter configured to, in response to the first signal being output for at least a second time or more, generate a second signal indicating an overcurrent of the semiconductor switching element, wherein the electronic circuitry changes, based on the second signal, at least one of: a first waveform related to driving of the semiconductor switching element based on the control signal; the second time; the first time; or the predetermined voltage.

Clause 2. The electronic circuitry according to clause 1, comprising a driver circuit configured to generate a driving signal having the first waveform supplied to a control terminal of the semiconductor switching element, wherein
the first waveform is a waveform of a constant driving current selected out of a plurality of constant driving currents,
the driver circuit changes, based on the second signal, the first waveform to a second waveform of the constant driving current different from the first waveform, and
the driver circuit generates, based on the control signal, a driving signal having the second waveform.

Clause 3. The electronic circuitry according to clause 1, comprising a driver circuit configured to generate a driving signal having the first waveform supplied to a control terminal of the semiconductor switching element, wherein
the first waveform is a waveform obtained by selecting a driving current at random from candidates of a plurality of driving currents for each of a plurality of time sections,
the driver circuit changes, based on the second signal, the first waveform to a third waveform having a combination of driving currents different from the first waveform, and
the driver circuit generates, based on the control signal, a driving signal having the third waveform.

Clause 4. The electronic circuitry according to clause 1, comprising a driver circuit configured to generate a driving signal having the first waveform supplied to a control terminal of the semiconductor switching element, wherein
the first waveform is a waveform obtained by changing a part of a basic waveform pattern by a first change amount,
the driver circuit changes, based on the second signal, the first waveform to a fourth waveform obtained by changing the part of the waveform pattern by a second change amount different from the first change amount, and
the driver circuit generates, based on the control signal, a driving signal having the fourth waveform.

Clause 5. The electronic circuitry according to clause 1, comprising a driver circuit configured to generate a driving signal having the first waveform supplied to a control terminal of the semiconductor switching element, wherein
the control signal includes a first pulse indicating conduction of the semiconductor switching element, and
the driver circuit changes the first waveform in response to ringing of the second signal being present later than a first threshold time from a start time point of the first pulse of the control signal.

Clause 6. The electronic circuitry according to clause 1, comprising a driver circuit configured to generate a driving signal having the first waveform supplied to a control terminal of the semiconductor switching element, wherein
the control signal includes a first pulse indicating conduction of the semiconductor switching element,
the second signal includes a second pulse indicating the overcurrent, and
the second filter changes the second time to a time longer than the second time in response to a start time point of the second pulse being later than a first threshold time from a start time point of the first pulse and an end time point of the second pulse not overlapping an end time point of the first pulse.

Clause 7. The electronic circuitry according to clause 1, comprising a driver circuit configured to generate a driving signal having the first waveform supplied to a control terminal of the semiconductor switching element, wherein
the control signal includes a first pulse indicating conduction of the semiconductor switching element,
the second signal includes a second pulse indicating the overcurrent,
the second filter changes the second time to a time longer than the second time in response to a start time point of the second pulse being later than a first threshold time from a start time point of the first pulse and an end time point of the second pulse not overlapping an end time point of the first pulse, and
the driver circuit changes the first waveform even after the second time is changed to a second threshold time in response to there being the second pulse whose start time point is later than the first threshold time from the start time point of the first pulse and whose end time point does not overlap the end time point of the first pulse.

Clause 8. The electronic circuitry according to clause 1, wherein
the control signal includes a first pulse indicating conduction of the semiconductor switching element,
the second signal includes a second pulse indicating the overcurrent, and
the comparison circuit changes the predetermined voltage to a voltage higher than the predetermined voltage in response to an end time point of the first pulse coinciding with an end time point of the second pulse or being included in the second pulse.

Clause 9. The electronic circuitry according to clause 1, wherein
the control signal includes a first pulse indicating conduction of the semiconductor switching element,
the second signal includes a second pulse indicating the overcurrent, and
the first filter changes the first time to a time longer than the first time in response to a start time point of the second pulse being included within a first threshold time from a start time point of the first pulse.

Clause 10. The electronic circuitry according to clause 1, comprising a driver circuit configured to generate a driving signal having the first waveform supplied to a control terminal of the semiconductor switching element, wherein
the control signal includes a first pulse indicating conduction of the semiconductor switching element,
the second signal includes a second pulse indicating the overcurrent,
the comparison circuit changes the predetermined voltage to a voltage higher than the predetermined voltage in response to an end time point of the first pulse coinciding with an end time point of the first pulse or is included in the second pulse,
the first filter changes the first time to a time longer than the first time in response to a start time point of the second pulse being included within a first threshold time from a start time point of the first pulse, and
after a position of the end time point of the first pulse does not coincide with the end time point of the second pulse and is not included in the second pulse, the first filter performs processing for changing the first time.

Clause 11. The electronic circuitry according to clause 1, further comprising:
a driver circuit configured to generate a driving signal having the first waveform supplied to a control terminal of the semiconductor switching element;
a memory configured to store a first parameter related to the first waveform; and
a control circuit, wherein
the driver circuit generates a driving signal having the first waveform according to the first parameter stored in the memory,
the control circuit changes, based on the second signal, a value of the first parameter to a value indicating a second waveform, and
the driver circuit generates a driving signal having the second waveform according to the first parameter after the change.

Clause 12. The electronic circuitry according to clause 11, wherein the control circuit changes the value of the first parameter to a value with which a waveform of a driving signal for suppressing ringing of a voltage generated between the first end and the second end at an ON time of the semiconductor switching element is obtained.

Clause 13. The electronic circuitry according to clause 6, further comprising:
a memory configured to store a second parameter indicating the second time; and
a control circuit, wherein
the second filter sets the second time according to the second parameter stored in the memory,
the control circuit changes a value of the second parameter stored in the memory to a value indicating a time longer than the second time, and
the second filter changes the second time according to the second parameter after the change.

Clause 14. The electronic circuitry according to clause 8, further comprising:
a memory configured to store a third parameter indicating the predetermined voltage; and
a control circuit, wherein
the comparison circuit sets the predetermined voltage according to the third parameter stored in the memory,
the control circuit changes a value of the third parameter stored in the memory to a value indicating a voltage larger than the predetermined voltage, and
the comparison circuit changes the predetermined voltage according to the third parameter after the change.

Clause 15. The electronic circuitry according to clause 9, further comprising:
a memory configured to store a fourth parameter indicating the first time; and
a control circuit, wherein
the comparison circuit sets the first time according to the fourth parameter stored in the memory,
the control circuit changes a value of the fourth parameter stored in the memory to a value indicating a time longer than the first time, and
the comparison circuit changes the first time according to the fourth parameter after the change.

Clause 16. The electronic circuitry according to any one of clauses 11 to 15, comprising an insulation signal transmitter configured to insulate a gate driver including the comparison circuit, the first filter, and the second filter from the control circuit, wherein
the insulation signal transmitter is connected to the control circuit via magnetic coupling, optical coupling, or capacitive coupling,
the insulation signal transmitter is connected to the gate driver via a wire, and
the control circuit transmits and receives signals to and from the gate driver via the insulation signal transmitter.

Clause 17. A method comprising:
acquiring a first voltage at a first node relating to a first end of a semiconductor switching element;
turning on, based on a control signal indicating conduction of the semiconductor switching element, for a first time, a first switch connected between the first node and a second end of the semiconductor switching element;
outputting a first signal in response to the first voltage being equal to or larger than a predetermined voltage;
in response to the first signal being output for at least a second time or more, generating a second signal indicating an overcurrent in the semiconductor switching element; and
changing, based on the second signal, at least one of a first waveform related to driving of the semiconductor switching element based on the control signal, the second time, the first time, and the predetermined voltage.

Clause 18. A computer program for executing:
a step of receiving a second signal from a second filter that receives a first signal from a comparison circuit that generates, based on a control signal indicating conduction of a semiconductor switching element, the first signal by comparing a first voltage at a first node and a predetermined voltage, the first node relating to a first end of the semiconductor switching element, a first switch connected between the first node and a second end of the semiconductor switching element being turned on for a first time, in response to the first signal being output at least for a second time or more, the second filter generating a second signal indicating an overcurrent in the semiconductor switching element; and
a step of changing, based on the second signal, at least one of a first waveform related to driving of the semiconductor switching element based on the control signal, the second time, the first time, and the predetermined voltage.

Clause 19. An electronic system comprising:
an inverter circuit including a plurality of pairs of semiconductor switching elements; and
an electronic circuitry corresponding to at least one semiconductor switching element among the plurality of pairs of semiconductor switching elements, wherein the electronic circuitry includes:
a comparison circuit configured to detect a first voltage at a first node relating to a first end of the semiconductor switching element and output a first signal in response to the first voltage being equal to or larger than a predetermined voltage;
a first filter including a first switch connected between the first node and a second end of the semiconductor switching element, the first filter turning on the first switch for a first time based on a control signal indicating conduction of the semiconductor switching element; and
a second filter configured to, in response to the first signal being output for at least a second time or more, generate a second signal indicating an overcurrent, and
the electronic circuitry changes, based on the second signal, at least one of a first waveform related to driving of the semiconductor switching element based on the control signal, the second time, the first time, and the predetermined voltage.

The invention claimed is:
1. An electronic circuitry comprising:
a comparison circuit configured to detect a first voltage at a first node relating to a first end of a semiconductor switching element and output a first signal in response to the first voltage being equal to or larger than a predetermined voltage;
a first filter including a first switch connected between the first node and a second end of the semiconductor switching element, the first filter turning on the first switch for a first time based on a control signal indicating conduction of the semiconductor switching element; and
a second filter configured to, in response to the first signal being output for at least a second time or more, generate a second signal indicating an overcurrent of the semiconductor switching element, wherein
the electronic circuitry changes, based on the second signal, at least one of: a first waveform related to driving of the semiconductor switching element based on the control signal, the second time, the first time, or the predetermined voltage, so that erroneous detection of the overcurrent due to ringing of the first voltage at turn-on of the semiconductor switching element is prevented, and a time from an occurrence of the overcurrent until a detection of the overcurrent does not exceed an allowable time in an event of the overcurrent.

2. The electronic circuitry according to claim 1, comprising a driver circuit configured to generate a driving signal having the first waveform supplied to a control terminal of the semiconductor switching element, wherein
the first waveform is a waveform of a constant driving current selected out of a plurality of constant driving currents,
the driver circuit changes, based on the second signal, the first waveform to a second waveform of the constant driving current different from the first waveform, and
the driver circuit generates, based on the control signal, a driving signal having the second waveform.

3. The electronic circuitry according to claim 1, comprising a driver circuit configured to generate a driving signal having the first waveform supplied to a control terminal of the semiconductor switching element, wherein
the first waveform is a waveform obtained by selecting a driving current at random from candidates of a plurality of driving currents for each of a plurality of time sections,
the driver circuit changes, based on the second signal, the first waveform to a third waveform having a combination of driving currents different from the first waveform, and
the driver circuit generates, based on the control signal, a driving signal having the third waveform.

4. The electronic circuitry according to claim 1, comprising a driver circuit configured to generate a driving signal having the first waveform supplied to a control terminal of the semiconductor switching element, wherein
the first waveform is a waveform obtained by changing a part of a basic waveform pattern by a first change amount,
the driver circuit changes, based on the second signal, the first waveform to a fourth waveform obtained by changing the part of the waveform pattern by a second change amount different from the first change amount, and
the driver circuit generates, based on the control signal, a driving signal having the fourth waveform.

5. The electronic circuitry according to claim 1, comprising a driver circuit configured to generate a driving signal having the first waveform supplied to a control terminal of the semiconductor switching element, wherein
the control signal includes a first pulse indicating conduction of the semiconductor switching element, and
the driver circuit changes the first waveform in response to ringing of the second signal being present later than a first threshold time from a start time point of the first pulse of the control signal.

6. The electronic circuitry according to claim 1, comprising a driver circuit configured to generate a driving signal having the first waveform supplied to a control terminal of the semiconductor switching element, wherein
the control signal includes a first pulse indicating conduction of the semiconductor switching element,
the second signal includes a second pulse indicating the overcurrent, and
the second filter changes the second time to a time longer than the second time in response to a start time point of the second pulse being later than a first threshold time from a start time point of the first pulse and an end time point of the second pulse not overlapping an end time point of the first pulse.

7. The electronic circuitry according to claim 6, further comprising:
a memory configured to store a second parameter indicating the second time; and
a control circuit, wherein
the second filter sets the second time according to the second parameter stored in the memory,
the control circuit changes a value of the second parameter stored in the memory to a value indicating a time longer than the second time, and
the second filter changes the second time according to the second parameter after the change.

8. The electronic circuitry according to claim 1, comprising a driver circuit configured to generate a driving signal having the first waveform supplied to a control terminal of the semiconductor switching element, wherein
the control signal includes a first pulse indicating conduction of the semiconductor switching element, the second signal includes a second pulse indicating the overcurrent,
the second filter changes the second time to a time longer than the second time in response to a start time point of the second pulse being later than a first threshold time from a start time point of the first pulse and an end time point of the second pulse not overlapping an end time point of the first pulse, and
the driver circuit changes the first waveform even after the second time is changed to a second threshold time in response to there being the second pulse whose start time point is later than the first threshold time from the start time point of the first pulse and whose end time point does not overlap the end time point of the first pulse.

9. The electronic circuitry according to claim 1, wherein
the control signal includes a first pulse indicating conduction of the semiconductor switching element,
the second signal includes a second pulse indicating the overcurrent, and
the comparison circuit changes the predetermined voltage to a voltage higher than the predetermined voltage in response to an end time point of the first pulse coinciding with an end time point of the second pulse or being included in the second pulse.

10. The electronic circuitry according to claim 9, further comprising:
a memory configured to store a third parameter indicating the predetermined voltage; and
a control circuit, wherein
the comparison circuit sets the predetermined voltage according to the third parameter stored in the memory,
the control circuit changes a value of the third parameter stored in the memory to a value indicating a voltage larger than the predetermined voltage, and
the comparison circuit changes the predetermined voltage according to the third parameter after the change.

11. The electronic circuitry according to claim 1, wherein
the control signal includes a first pulse indicating conduction of the semiconductor switching element,
the second signal includes a second pulse indicating the overcurrent, and
the first filter changes the first time to a time longer than the first time in response to a start time point of the second pulse being included within a first threshold time from a start time point of the first pulse.

12. The electronic circuitry according to claim 11, further comprising:
a memory configured to store a fourth parameter indicating the first time; and
a control circuit, wherein
the comparison circuit sets the first time according to the fourth parameter stored in the memory,
the control circuit changes a value of the fourth parameter stored in the memory to a value indicating a time longer than the first time, and
the comparison circuit changes the first time according to the fourth parameter after the change.

13. The electronic circuitry according to claim 1, comprising a driver circuit configured to generate a driving signal having the first waveform supplied to a control terminal of the semiconductor switching element, wherein
the control signal includes a first pulse indicating conduction of the semiconductor switching element,
the second signal includes a second pulse indicating the overcurrent,
the comparison circuit changes the predetermined voltage to a voltage higher than the predetermined voltage in response to an end time point of the first pulse coinciding with an end time point of the first pulse or is included in the second pulse,
the first filter changes the first time to a time longer than the first time in response to a start time point of the second pulse being included within a first threshold time from a start time point of the first pulse, and
after a position of the end time point of the first pulse does not coincide with the end time point of the second pulse and is not included in the second pulse, the first filter performs processing for changing the first time.

14. The electronic circuitry according to claim 1, further comprising:
a driver circuit configured to generate a driving signal having the first waveform supplied to a control terminal of the semiconductor switching element;
a memory configured to store a first parameter related to the first waveform; and
a control circuit, wherein
the driver circuit generates a driving signal having the first waveform according to the first parameter stored in the memory,
the control circuit changes, based on the second signal, a value of the first parameter to a value indicating a second waveform, and
the driver circuit generates a driving signal having the second waveform according to the first parameter after the change.

15. The electronic circuitry according to claim 14, wherein the control circuit changes the value of the first parameter to a value with which a waveform of a driving signal for suppressing ringing of a voltage generated between the first end and the second end at an ON time of the semiconductor switching element is obtained.

16. The electronic circuitry according to claim 14, comprising an insulation signal transmitter configured to insulate a gate driver including the comparison circuit, the first filter, and the second filter from the control circuit, wherein
the insulation signal transmitter is connected to the control circuit via magnetic coupling, optical coupling, or capacitive coupling,
the insulation signal transmitter is connected to the gate driver via a wire, and
the control circuit transmits and receives signals to and from the gate driver via the insulation signal transmitter.

17. A method comprising:
acquiring a first voltage at a first node relating to a first end of a semiconductor switching element;
turning on, based on a control signal indicating conduction of the semiconductor switching element, for a first time, a first switch connected between the first node and a second end of the semiconductor switching element;
outputting a first signal in response to the first voltage being equal to or larger than a predetermined voltage;
in response to the first signal being output for at least a second time or more, generating a second signal indicating an overcurrent in the semiconductor switching element; and
changing, based on the second signal, at least one of a first waveform related to driving of the semiconductor switching element based on the control signal, the second time, the first time, and the predetermined voltage, so that erroneous detection of the overcurrent due to ringing of the first voltage at turn-on of the semiconductor switching element is prevented, and a time from an occurrence of the overcurrent until detection of the overcurrent does not exceed an allowable time in an event of the overcurrent.

18. A non-transitory computer readable medium having a computer program, which is executable by a processor, for executing:

a step of receiving a second signal from a second filter that receives a first signal from a comparison circuit that generates, based on a control signal indicating conduction of a semiconductor switching element, the first signal by comparing a first voltage at a first node and a predetermined voltage, the first node relating to a first end of the semiconductor switching element, a first switch connected between the first node and a second end of the semiconductor switching element being turned on for a first time, in response to the first signal being output at least for a second time or more, the second filter generating a second signal indicating an overcurrent in the semiconductor switching element; and a step of changing, based on the second signal, at least one of a first waveform related to driving of the semiconductor switching element based on the control signal, the second time, the first time, and the predetermined voltage so that erroneous detection of the overcurrent due to ringing of the first voltage at turn-on of the semiconductor switching element is prevented, and a time from an occurrence of the overcurrent until detection of the overcurrent does not exceed an allowable time in an event of the overcurrent.

19. An electronic system comprising:

an inverter circuit including a plurality of pairs of semiconductor switching elements; and an electronic circuitry corresponding to at least one semiconductor switching element among the plurality of pairs of semiconductor switching elements, wherein the electronic circuitry includes:

a comparison circuit configured to detect a first voltage at a first node relating to a first end of the semiconductor switching element and output a first signal in response to the first voltage being equal to or larger than a predetermined voltage;

a first filter including a first switch connected between the first node and a second end of the semiconductor switching element, the first filter turning on the first switch for a first time based on a control signal indicating conduction of the semiconductor switching element; and a second filter configured to, in response to the first signal being output for at least a second time or more, generate a second signal indicating an overcurrent, and the electronic circuitry changes, based on the second signal, at least one of a first waveform related to driving of the semiconductor switching element based on the control signal, the second time, the first time, and the predetermined voltage so that erroneous detection of the overcurrent due to ringing of the first voltage at turn-on of the semiconductor switching element is prevented, and a time from an occurrence of the overcurrent until detection of the overcurrent does not exceed an allowable time in an event of the overcurrent.

* * * * *